United States Patent
Van Veen et al.

(10) Patent No.: US 12,244,348 B2
(45) Date of Patent: Mar. 4, 2025

(54) SYSTEM AND METHOD FOR MULTIMODULATION IN A PASSIVE OPTICAL NETWORK

(71) Applicant: NOKIA SOLUTIONS AND NETWORKS OY, Espoo (FI)

(72) Inventors: Doutje Van Veen, New Providence, NJ (US); Amitkumar Mahadevan, Edison, NJ (US); Vincent Houtsma, New Providence, NJ (US)

(73) Assignee: Nokia Solutions and Networks Oy, Espoo (FI)

( * ) Notice: Subject to any disclaimer, the term of this patent is extended or adjusted under 35 U.S.C. 154(b) by 107 days.

(21) Appl. No.: 17/714,959

(22) Filed: Apr. 6, 2022

(65) Prior Publication Data

US 2023/0327776 A1    Oct. 12, 2023

(51) Int. Cl.
 *H04B 10/54* (2013.01)
 *H04L 27/26* (2006.01)

(52) U.S. Cl.
 CPC ....... *H04B 10/541* (2013.01); *H04L 27/2626* (2013.01)

(58) Field of Classification Search
 CPC .......................... H04B 10/5161; H04B 10/541
 See application file for complete search history.

(56) References Cited

U.S. PATENT DOCUMENTS

| | | |
|---|---|---|
| 8,724,994 B2 | 5/2014 | Luo et al. |
| 10,601,629 B2 | 3/2020 | Krishnan et al. |
| 2009/0123151 A1 | 5/2009 | Nagel et al. |
| 2015/0055957 A1 | 2/2015 | Lee et al. |
| 2018/0167143 A1 | 6/2018 | Yao et al. |
| 2019/0132164 A1* | 5/2019 | Yu .......................... H04B 10/69 |
| 2019/0149389 A1 | 5/2019 | Torbatian et al. |
| 2020/0280468 A1* | 9/2020 | Cho ..................... H04B 10/516 |
| 2021/0281321 A1 | 9/2021 | Ye |

FOREIGN PATENT DOCUMENTS

| | | | | |
|---|---|---|---|---|
| WO | WO2019019073 | * | 1/2019 | .......... H04B 10/272 |
| WO | 2020142726 A1 | | 7/2020 | |

OTHER PUBLICATIONS

Jun Sugawa, Adaptive FEC control in downstream collaborating with traffic control in OLT for WDM/TDM-PON, https://ieeexplore.ieee.org/document/7341815, 2015, 2 pages, European Conference on Optical Communication (ECOC).

(Continued)

*Primary Examiner* — Nathan M Cors
(74) *Attorney, Agent, or Firm* — Jessica W. Smith; LOZA & LOZA, LLP

(57) ABSTRACT

An optical line terminal (OLT) in flexible passive optical network (PON) transmits a downstream signal with two or more modulation formats, wherein at least one of the modulation formats is a modified PAMx modulation format and wherein x is greater than 2. The modified PAMx modulation encodes data bits such that the probability of at least one predetermined transition between amplitude levels is modified. Furthermore, an optical network unit (ONU) in the flexible PON is assigned to one of the plurality of modulation formats based on one or more parameters, such as configuration of the ONU and line conditions.

21 Claims, 22 Drawing Sheets

(56) References Cited

OTHER PUBLICATIONS

Sepideh Nikmanzar, On-Demand Video Streaming Schemes Over Shared-WDM-PONs, https://ieeexplore.ieee.org/document/6488795, Sep. 2013, vol. 23, Issue: 9, IEEE Transactions on Circuits and Systems for Video Technology.
Corresponding EP Appln. No. 23164892.4. Extended Search Report (Aug. 10, 2023).
Corresponding EP Appln. No. 23164892.4. Extended Search Report (Nov. 21, 2023).

* cited by examiner

| Data Bits | Codebook (starting at 0 level) | Complementary codebook (starting at 3 level) | Bit pattern | Codebook (starting at 0 level) | Complementary codebook (starting at 3 level) |
|---|---|---|---|---|---|
| 00000 | 0000 | 3333 | 10000 | 0013 | 3320 |
| 00001 | 0020 | 3313 | 10001 | 0113 | 3220 |
| 00010 | 0200 | 3133 | 10010 | 0213 | 3120 |
| 00011 | 0110 | 3223 | 10011 | 0123 | 3210 |
| 00100 | 0220 | 3113 | 10100 | 0233 | 3100 |
| 00101 | 1120 | 2213 | 10101 | 1223 | 3110 |
| 00110 | 1100 | 2233 | 10110 | 1113 | 2220 |
| 00111 | 1010 | 2323 | 10111 | 1023 | 2310 |
| 01000 | 1310 | 2023 | 11000 | 1333 | 2000 |
| 01001 | 1210 | 2123 | 11001 | 1313 | 2020 |
| 01010 | 2000 | 1333 | 11010 | 2023 | 1310 |
| 01011 | 2020 | 1313 | 11011 | 1133 | 2200 |
| 01100 | 2110 | 1223 | 11100 | 2123 | 1210 |
| 01101 | 2200 | 1133 | 11101 | 2213 | 1120 |
| 01110 | 2220 | 1113 | 11110 | 2233 | 1100 |
| 01111 | 2320 | 1013 | 11111 | 2333 | 1000 |

FIG. 10

Conventional PAM4

AA 000  AC 010  BC 101  DC 011
AB 001  BD 100  CD 110  DD 111

Modified PAM4

Conventional QPSK

Modified QPSK

Conventional 8QAM

Modified 8QAM

SYSTEM AND METHOD FOR MULTIMODULATION IN A PASSIVE OPTICAL NETWORK

BACKGROUND

Field of the Disclosure

The present disclosure relates generally to a passive optical network, and more particularly, to a passive optical network with multimodulation capabilities.

Description of the Related Art

A passive optical network (PON) is often used in access networks for connecting individual subscribers or groups of subscribers to a core telecommunications network. A typical PON includes, among other components, an optical line terminal (OLT) in a central office (CO) and a plurality of Optical Network Units (ONUs) (also called optical network terminals (ONTs)) located at subscriber premises. In this point to multi-point (p2mp) architecture, an OLT broadcasts a downstream signal at a specified wavelength to multiple ONUs over an optical distribution network (ODN). Current OLTs broadcast a non-return to zero (NRZ) modulated downstream signal with for example 10 Gb/s bit rate.

Currently PONs are upgraded by providing a higher bitrate signal on a new wavelength. This implementation of a new wavelength requires that legacy ONUs need to be replaced or upgraded to take advantage of the higher bit rate signal. However, it is logistically difficult and expensive to modify/upgrade the currently deployed ONUs located at the subscribers' premises to be able to handle the new wavelength and higher bitrate signal. Subscribers must agree to the upgrade and such upgrades may not ever be requested.

One alternative is to upgrade the OLTs in the central office to provide the higher bit rate signal to upgraded ONUs, but still provide backwards compatibility with legacy ONUs. The legacy ONUs may wait to be upgraded upon subscriber request and/or decommissioning of the legacy ONUs. Thus, one or more solutions are needed for providing backwards compatibility with legacy ONUs when the downstream signal in a flexible PON is upgraded to a higher bit rate signal.

Note that the techniques or schemes described herein as existing or possible are presented as background for the present invention, but no admission is made thereby that these techniques and schemes were heretofore commercialized or known to others besides the inventors. These needs and other needs are discussed further and addressed by the description.

SUMMARY

The following presents a summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In one aspect, a device comprises a signal encoder configured to generate a digital encoding signal for a modulation with a number Np of constellation points in a constellation diagram of the modulation, wherein Np is greater than 2; and a modulator for modulating a carrier signal using the digital encoding signal to generate a modulated signal, wherein the digital encoding signal and the modulated signal have an adapted probability of at least one transition between one or more constellation points.

In another aspect, an optical device includes a signal encoder configured to generate a digital encoding signal using a first modulation format and a different, second modulation format, wherein the second modulation format is a modified pulse amplitude modulation having x amplitude levels (PAMx), wherein x is greater than 2; and a modulator for modulating a first wavelength of an optical signal using the digital encoding signal, wherein a first portion of the optical signal is modulated with the first modulation format and a second portion of the optical signal is modulated with the second modulation format, wherein the second portion of the optical signal modulated with the modified PAMx format has an adapted probability of at least one predetermined transition between one or more amplitude levels.

In another aspect, an optical network unit in a passive optical network includes at least one optical signal detector circuit configured to receive an optical signal broadcast in the PON, wherein the optical signal includes a first portion modulated with a first modulation format and a second portion modulated with a second modulation format, wherein the second modulation format includes a pulse amplitude modulation having x amplitude levels (PAMx), wherein x is greater than 2, and wherein the second portion of the optical signal modulated with a modified PAMx format has an adapted probability of a predetermined transition between a first amplitude level and a second amplitude level. The optical network unit also includes at least one clock and data recovery (CDR) circuit configured to perform clock recovery during the first portion of the optical signal modulated with a first modulation format and during the second portion of the optical signal modulated with a modified PAMx format.

In one or more of the above aspects, the signal encoder is configured to generate the digital encoding signal by at least one of: encoding blocks of N data bits to patterns of L constellation points using one or more codebooks, wherein L is greater than one and the patterns have the adapted probability of the at least one transition between one or more constellation points; or by encoding, using at least one state machine with a plurality of states, the blocks of N data bits to the patterns of L constellation points, wherein the mapped patterns have the adapted probability of the at least one transition between one or more constellation points.

In one or more of the above aspects, the signal encoder is configured to generate the digital encoding signal by encoding the blocks of N data bits to the patterns of L constellation points, wherein the patterns are selected to have either an increased or decreased probability of a transition between a first constellation point and a second different constellation point.

In one or more of the above aspects, the signal encoder is configured to generate the digital encoding signal by encoding the blocks of N data bits to the patterns of L constellation points, wherein the patterns are selected to have either an increased or decreased probability of a transition between a first constellation point and the same first constellation point.

In one or more of the above aspects, the signal encoder is configured to generate the digital encoding signal by selecting consecutive first and second patterns to adapt the probability of the at least one transition between one or more constellation points.

In one or more of the above aspects, the signal encoder is configured to select consecutive first and second symbol patterns to adapt the probability of the at least one transition by: selecting the first pattern having a terminating constellation point PT; and selecting the second pattern having an initial constellation point PI, wherein the constellation points PT and PI are the same.

In one or more of the above aspects, the signal encoder is configured to select consecutive first and second patterns to adapt the probability of the at least one transition by: selecting the first pattern having a terminating symbol PT; and selecting the second pattern having an initial symbol PI, wherein the constellation points PT and PI are one of a plurality of predetermined patterns.

In one or more of the above aspects, the modulation includes at least one of: a pulse amplitude modulation (PAM) having greater than two amplitude levels; a phase shift keying (PSK) modulation having greater than two phases; or a quadrature amplitude modulation (QAM) having greater than two constellation points.

In one or more of the above aspects, the optical device is configured to broadcast the modulated signal to a plurality of optical network units (ONUs) in a point to multipoint optical network.

In one or more of the above aspects, the optical device includes at least one processor and at least one memory, wherein the at least one memory stores instructions that, when executed by the at least one processor, causes the optical device to: assign the first modulation to a first ONU of the plurality of ONUs; and assign the second modulation to a second ONU of the plurality of ONUs.

In one or more of the above aspects, the at least one memory stores instructions that when executed by the at least one processor, cause the optical device to: obtain one or more parameters associated with at least the first ONU and the second ONU, wherein the parameters include one or more of: configuration information; signal quality of the optical signal; link budget; or subscriber status information.

In one or more of the above aspects, the at least one memory stores instructions that when executed by the at least one processor, cause the optical device to: assign the first modulation to the first ONU in response to the one or more parameters associated with the first ONU; and assign the second modulation to the second ONU in response to the one or more parameters associated with the second ONU.

In one or more of the above aspects, the first modulation format includes a non-return to zero (NRZ) format and the second modulation format includes a 4-level pulse amplitude modulation (PAM4), wherein the NRZ format has a lower bit rate than the modified PAM4 format.

In one or more of the above aspects, the signal encoder is configured to generate the digital encoding signal using the PAMx format by at least one of: encoding blocks of N data bits to a set of symbol patterns of L symbols using one or more codebooks, wherein the set of symbol patterns includes the adapted probability of the at least one predetermined transition between one or more amplitude levels; or encoding, using at least one state machine with a plurality of states, the blocks of N data bits to a set of symbol patterns of L symbols, wherein the mapped constellation patterns have the adapted probability of the at least one transition between one or more constellation points.

In one or more of the above aspects, the signal encoder is configured to generate the digital encoding signal using the PAMx format by encoding the blocks of N data bits to the set of symbol patterns of L symbols, wherein the set of symbol patterns includes either an increased or decreased probability of a transition between a first amplitude level and a different, second amplitude level.

In one or more of the above aspects, the signal encoder is configured to generate the digital encoding signal using the PAMx format by encoding the blocks of N data bits to the set of symbol patterns of L symbols, wherein the set of symbol patterns includes either an increased or decreased probability of a transition between a first amplitude level and the same first amplitude level.

In one or more of the above aspects, the signal encoder is configured to generate the digital encoding signal using the PAMx format by selecting consecutive first and second symbol patterns to generate the adapted probability of the at least one predetermined transition between one or more amplitude levels.

In one or more of the above aspects, the signal encoder is configured to select the consecutive first and second symbol patterns to adapt the at least one predetermined transition between one or more amplitude levels by selecting the first symbol pattern having a terminating symbol ST; and selecting the second symbol pattern having an initial symbol SI, wherein an amplitude level of ST and SI is the same.

In one or more of the above aspects, the optical network unit of claim includes a signal decoder configured to decode the first portion of the optical signal modulated with the first modulation format.

In one or more of the above aspects, the optical network unit includes a signal decoder configured to decode the first portion of the optical signal modulated with the first modulation format and the second portion of the optical signal modulated with the modified PAMx format.

In one or more of the above aspects, the signal decoder is configured to decode the second portion of the optical signal modulated with the modified PAMx format by determining a symbol pattern of L symbols and determining a block of N data bits mapped to the symbol pattern of L symbols using one or more codebooks.

In one or more of the above aspects, the signal decoder is configured to decode the second portion of the optical signal modulated with the modified PAMx format by determining a symbol pattern of L symbols and determining a block of N data bits mapped to the symbol pattern of L symbols using at least one state machine including a plurality of states.

Additional aspects are set forth, in part, in the detailed description, figures and claims which follow, and in part may be derived from the detailed description, or may be learned by practice of one or more embodiments herein. It is to be understood that both the foregoing general description and the following detailed description are exemplary and explanatory only and are not restrictive of other possible embodiments in the claims hereinbelow.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 10 illustrates an embodiment of a codebook database for encoding and decoding a modified PAM4 signal.

DETAILED DESCRIPTION

The description herein may be embodied in other specific apparatus and/or methods. The described embodiments are to be considered in all respects as only illustrative and not restrictive. In particular, the scope of the invention is indicated by the appended claims rather than by the description and figures herein. Embodiments within the meaning and range of equivalency of the claims are to be embraced within their scope.

Figure 1:
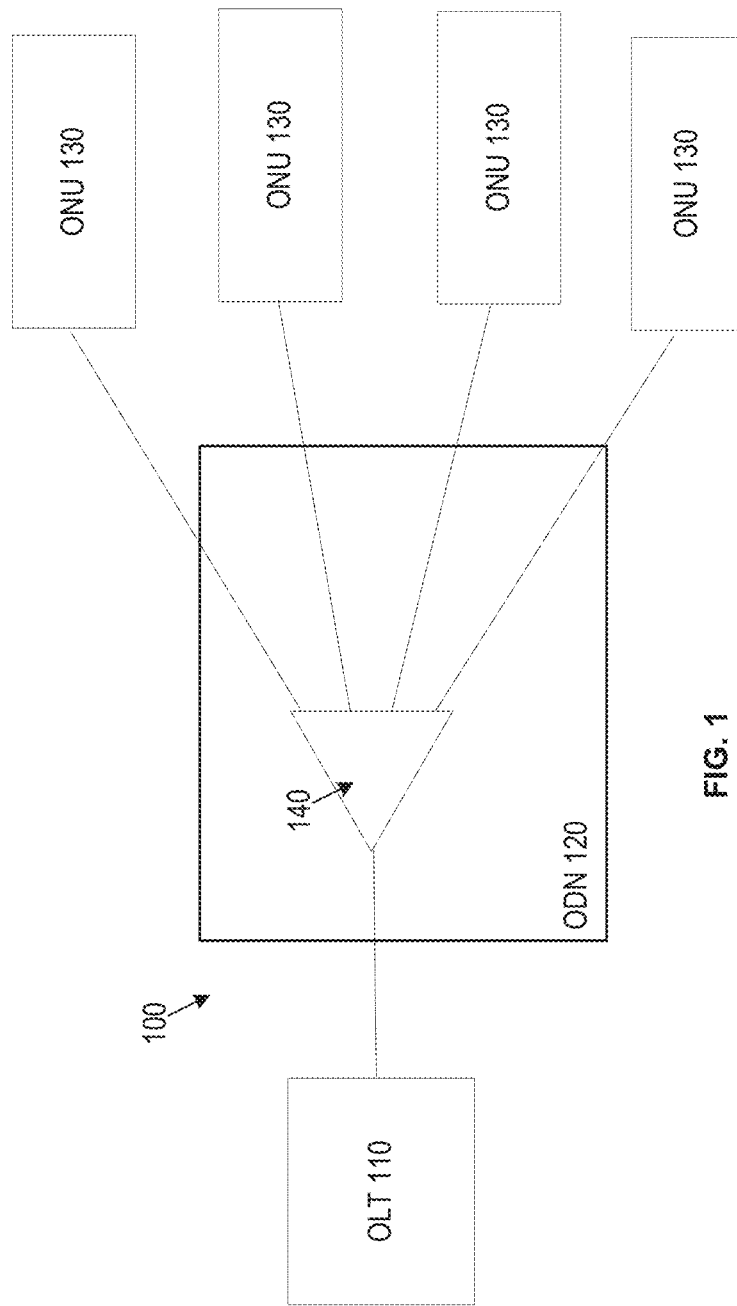
FIG. 1 illustrates a schematic diagram of selected components of an exemplary PON in which some embodiments herein may be implemented.

FIG. 1 is a schematic diagram illustrating selected components of an exemplary PON 100 in which some embodiments may be implemented. Note that PON 100 may, and in many implementations will, include additional components, and the configuration shown in FIG. 1 is intended to be exemplary rather than limiting. The PON 100 includes at least one OLT 110, an optical distribution network (ODN) 120 including at least one splitter/combiner 140, and a plurality of ONUs 130. In an embodiment, the PON network 100 is based on a point to multi-point (p2mp) architecture wherein the OLT 110 broadcasts a time division multiplexed (TDM) downstream signal to the multiple ONUs 130 over a first downstream wavelength. In the upstream direction, the communication from the plurality of ONUs 130 to the OLT 110 is achieved via burst mode time-division multiple access signal on a second upstream wavelength, which is different from the downstream wavelength.

The ONUs 130 are located at different subscriber premises and are connected or connectable to a subscriber network and/or one or more devices of the subscriber (not shown). The OLT 120 is typically located at a service provider location referred to as a central office. The central office may house multiple OLTs 110, each managing their own respective plurality of ONUs 130. The OLT 110 communicates directly or indirectly with various sources of content and network-accessible services (not shown) that are or may be made available to the subscribers associated with the PON 100.

In an embodiment, the ODN 120 may be a data distribution system, which may comprise optical fiber cables, couplers, splitters, distributors, and/or other equipment. In an embodiment, the optical fiber cables, couplers, splitters, distributors, and/or other equipment may be passive optical components. Specifically, the optical fiber cables, couplers, splitters, distributors, and/or other equipment may be components that do not require power to distribute data signals between the OLT 110 and the ONUs 130. Alternatively, the ODN 120 may comprise one or a plurality of processing equipment, such as optical amplifiers. The ODN 120 may typically extend from the OLT 110 to the ONUs 130 in a branching configuration but may be alternatively configured in any other point-to-multi-point configuration.

At least one splitter/combiner 140 in the ODN 120 splits and distributes the downstream signal from the OLT 110 to the plurality of ONUs 130. As such, the ONUs 130 receive the same downstream signal from the OLT 110. The splitter/combiner 140 also serves as a combiner for combining upstream traffic from the ONUs 130 to the OLT 110. The splitter/combiner 140 may be located, for example, in a street-side cabinet near the subscribers' premises. This cabinet or similar structure may be referred to as the outside plant. Note, however, that no particular network device or configuration is a requirement of the present embodiments.

The ITU-T recently approved a time-division multiplexing (TDM) PON standard that employs 50 Gb/s per wavelength (λ) non-return to zero (NRZ) modulation in the downstream (DS) signal and either 12.5 Gb/s or 25 Gb/s per wavelength NRZ modulation in the upstream (US) signal. See, Recommendation ITU-T G.9804.3, "50-Gigabit-capable passive optical networks (50G-PON): Physical media dependent (PMD) layer specification" (September 2021). In addition to ITU-T G.9804.3, the embodiments described herein may also be implemented in PON systems compliant in whole or in part to ITU-T Recommendations G.987 dated June 2012 (XG-PON) or to the ITU-T Recommendation G.9807 dated June 2016 (XGS-PON) or to ITU-T Recommendation G.989 (NG-PON2) or to IEEE 802.3ca standard dated June 2020 (25G-EPON, 50G-EPON). Though these specific standards are cited, the embodiments described herein may be implemented in other standards, current or future. In addition, the embodiments described herein may be implemented in other types of networks.

The ITU-T G.9804.3 standard still employs NRZ modulation for a 50 Gb/s rate per wavelength (λ) in the downstream signal. To obtain higher bit rates, different modulation formats may be necessary. For example, 4 level pulse amplitude modulation (PAM4) has been proposed for modulation of the downstream signal. While NRZ includes two amplitude levels, PAM4 includes four amplitude levels. In one example, to upgrade to PAM4 modulation, a new downstream wavelength may be implemented with PAM4 modulated signals. In this example, the OLT 110 needs to be upgraded as well as the ONUs 130 to receive and transmit the new downstream wavelength. Since the OLT 110 is located in the central office and accessible to a network operator, it may be more easily upgraded within a predetermined time period. However, the ONUs 130 in the field are more difficult to upgrade. For example, the upgrades of the ONUs may only occur upon a subscriber request. Since some subscribers may never request to upgrade, the legacy ONUs may remain with equipment that is configured for NRZ or other legacy modulations. Thus, in an embodiment, rather than upgrading to PAM4 modulation on a new downstream wavelength, a flexible PON is proposed that includes two or more modulation formats on the same downstream wavelength.

Figure 2:
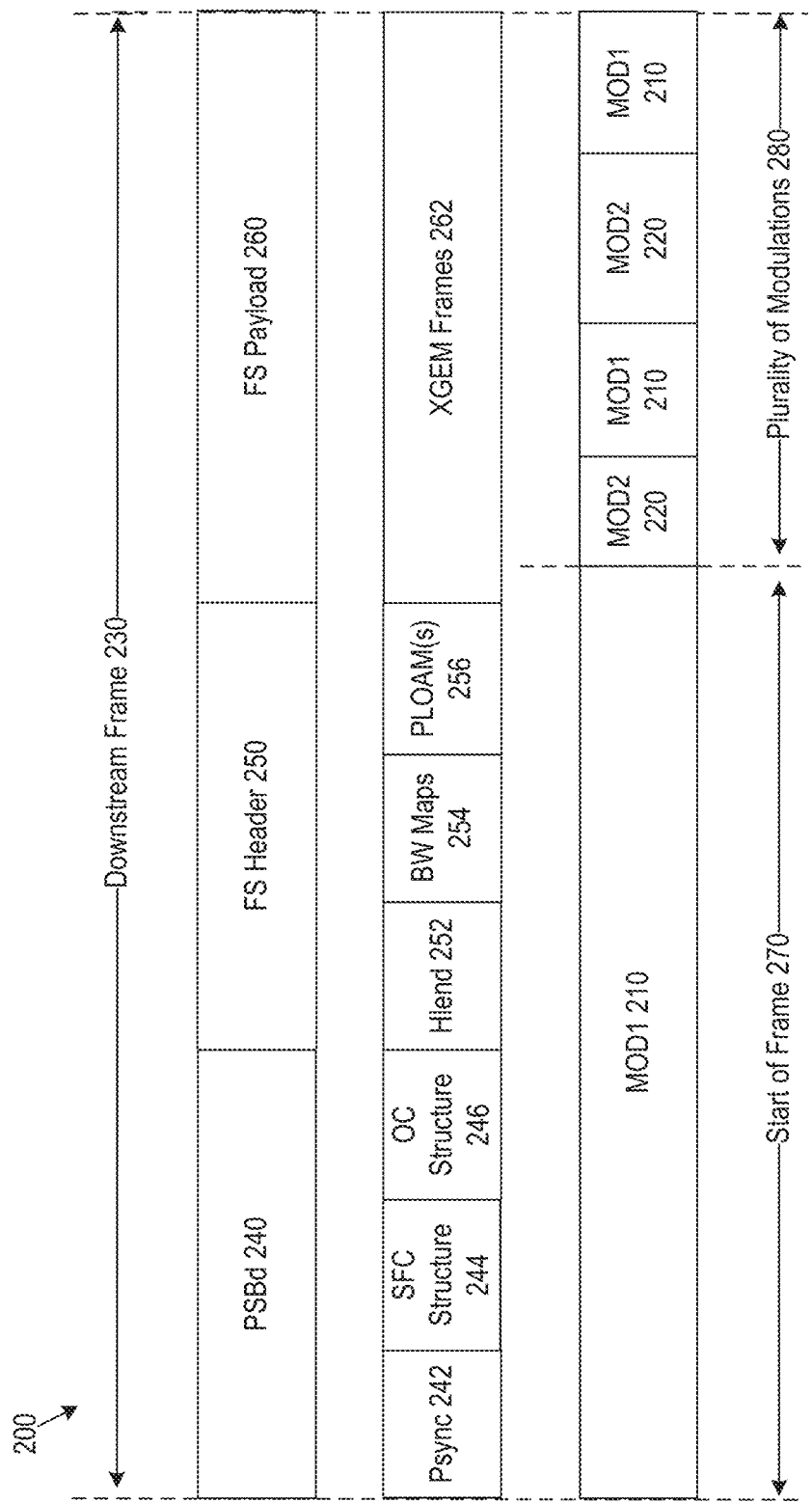
FIG. 2 illustrates a schematic diagram illustrating of an embodiment of a frame format for a multimodulation downstream signal.

FIG. 2 illustrates a schematic diagram of an embodiment of a frame format 230 for a multimodulation downstream signal 200. One mechanism to address backward compatibility with legacy ONUs 130 is by employing multimodulation in the downstream signal 200, e.g. including two or more modulation formats on the same wavelength in the downstream signal. FIG. 2 illustrates an exemplary PON downstream frame format 230 that spans a duration of 125 microseconds for 50 Gb/s downstream frame with NRZ transmission. The frame 230 includes 360 forward error correction (FEC) codewords each of length 17280 bits (6220800 bits in all).

The frame 230 includes a Physical Synchronization Block downstream (PSBd) 240, a Framing Sublayer (FS) header 250 and a FS payload 260. The PSBd 240 includes three separate structures, e.g., a Physical Synchronization sequence (Psync) 242, a Superframe Counter (SFC) Structure 244 and an Operation Control (OC) structure 246. The start of the downstream PHY frame is bound to transmission or receipt of the first bit of the PSync sequence 242. The ONU uses this sequence to achieve alignment at the downstream PHY frame boundary. The SFC structure 244 includes a superframe counter (SFC) and a hybrid error control (HEC). The SFC value in each downstream PHY frame is incremented by one with respect to the previous PHY frame. Whenever the SFC reaches its maximum value (all ones), it is set to 0 on the following downstream PHY frame. The OC structure 246 includes the OLT identification and optical parameters of the transceiver.

The FS Header 250 includes a (Header Length downstream) HLend structure 252, a bandwidth map (BWmap) 254 structure and Physical Layer Operations, Administration and Maintenance (PLOAM) structure 256. HLend is a structure that controls the size of the variable length partitions within the downstream FS header 250. The BWmap 254 is used to allocate upstream transmissions. The PLOAM 256 includes one or more PLOAM messages. The FS payload comprises a series of XGEM frames addressed to specific XGEM port-IDs.

To ensure backward compatibility, information that is intended for both legacy and advanced ONUs 130 is modulated with a legacy modulation MOD1. For example, the start of the frame 270, including the PSBd 240 and FS Header 250, are encoded with a legacy modulation MOD1 (such as NRZ). The legacy modulation may extend beyond the end of the FS header portion in order to align with FEC codeword boundaries. For example, the start of the frame 270 may correspond to a predetermined number of FEC codewords, such as 10 FEC codewords. The legacy modulation MOD1 in the start of the frame 270 may be decoded by both the legacy and advanced ONUs 130 receiving the frame 230.

The FS payload 260 comprises a series of XGEM frames 262 addressed to specific XGEM port-IDs. The FS payload 260 may be encoded using a plurality of modulation formats 280. For example, it may include a first legacy modulation MOD1 (such as, e.g. NRZ) that is interleaved in one or more first portions 210 with a second modulation MOD2 (e.g., such as PAM4) in one or more second portions 220. The first legacy modulation may have a lower bit rate (such as 50 Gb/s for NRZ) than the second modulation (such as 100 Gb/s for PAM4). These portions 210 of the payload modulated with MOD1 may be decoded by all the ONUs (legacy and advanced). But portions 220 of the payload modulated with MOD2 may only be decoded by advanced ONUs 130 and not legacy ONUs 130. The portions 210, 220 may have varying length depending on the balance of usage between the legacy and advanced ONUs 130.

The frame format 230 in PON 100 described herein is exemplary only. Other types of frame formats may be implemented in a flexible, multimodulation PON 100 or implemented in other types of networks may be employed herein.

Figure 3:
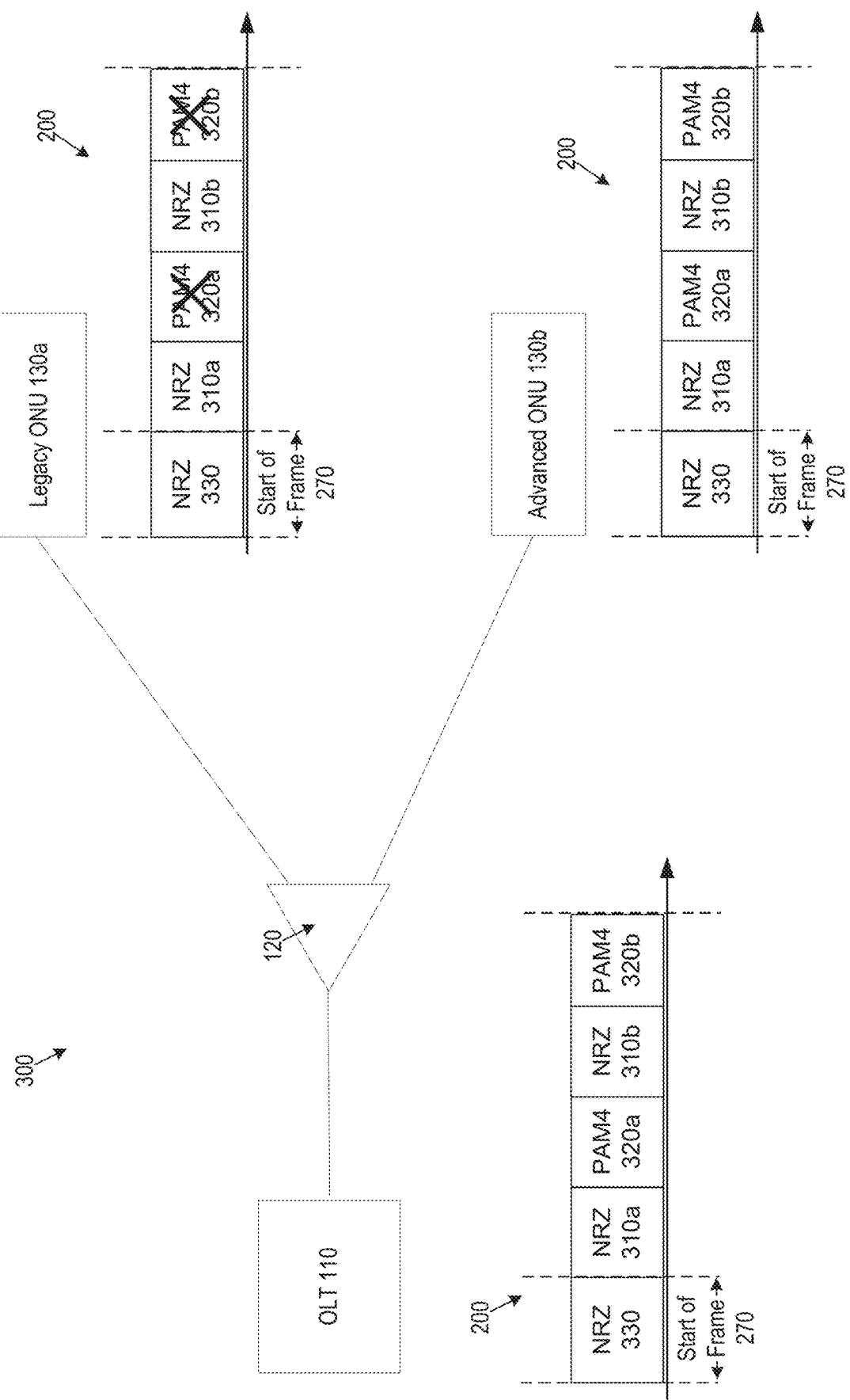
FIG. 3 illustrates a schematic diagram of an embodiment of a PON with a multimodulation downstream signal.

FIG. 3 illustrates a schematic diagram of an embodiment of a PON 300 with a multimodulation system. The PON 300 includes a multimodulation OLT 110 (i.e., an OLT capable of transmitting a downstream signal with two or more modulations on a same wavelength) and a mixture of legacy ONUs 130a and advanced ONUs 130b. In this exemplary embodiment, a first modulation includes a non-return to zero (NRZ) modulation and a higher order modulation includes 4-Level Pulse Amplitude Modulation with four amplitude levels (PAM4). In such an exemplary network, the hybrid modulation OLT 110 transmits a downstream signal 200 including both modulations to the legacy ONUs 130a and the advanced ONUs 130b.

In this example of FIG. 3, the OLT 110 interleaves PAM4 modulated portions 320a-b with NRZ modulated portions 310a-b in the downstream signal 200. The portions 310a-b and 320a-b may have different durations depending on usage by the various ONUs 130. As described with respect to FIG. 2, a start of the frame 270 is modulated with NRZ so that both the legacy and advanced ONUs may decode the information. The legacy ONUs 130a are operable to decode the portions 310a-b with NRZ modulation, and the advanced or upgraded ONUs 130b are operable to receive and decode the portions 310 of the payload with NRZ modulation and the portions 320 with PAM4 modulation.

The PAM4 modulation is a multilevel modulation format with four amplitude levels. Conventional PAM4 modulation encodes two bits into each symbol. This effectively doubles a network's data rate from NRZ modulation, enabling for example 50 Gb/s to 100 Gb/s or higher bit rates for transmission in a PON. The advanced or upgraded ONUs 130b capable of successfully detecting and decoding the higher bit rate PAM4 modulated signal 320 may thus have services with a higher throughput as compared with the legacy ONUs 130a that can only detect and decode the NRZ modulated signal 310. Thus, by using a plurality of modulation formats on a same wavelength, different modulations and line rates may be assigned to ONUs, e.g. based on one or more factors such as ONU capability and link budgets.

In an embodiment, the different modulations are applied to forward error correction (FEC) codewords as a minimum unit rather than symbol-by-symbol modulations. Thus, each portion 310 and 320 may include one or more FEC codewords. Such multimodulation signals may thus be encoded per codeword or over a group of codewords. In another embodiment, the portions may correspond to one or more PON frames, e.g. as defined in one or more PON standards described herein and/or within one or more variable or fixed time windows. Other partitions between the portions of the two or more types of modulations in the downstream signal 200 may also be implemented herein.

One of the challenges of multimodulation in the point to multi-point network is that the legacy ONUs 130 a still need to maintain synchronization with the transmitter clock in the downstream signal 200 even during the PAM4 modulated signal 320. For example, clock recovery needs to continue working when the ONU 130 receives a PAM4 signal at the NRZ sensitivity limit. Clock recovery includes detecting embedded clock information in the data stream, allowing the clock timing of the OLT 110 to be determined by the ONU 130. The embedded clock information is used in a phase-locked loop or similar adjustable oscillator to produce a local clock signal that can be used to time the downstream signal in the periods between the clock signals. Maintaining synchronization to the transmitter clock is also critical for upstream performance since the downstream clock recovered at the ONU 130 is re-used to clock its upstream transmission. The upstream transmission performance might therefore be impacted by any performance issues in synchronization as well.

In addition to problems with legacy ONUs 130a, some upgraded or advanced ONUs 130 may have difficulties in detecting and decoding a PAM4 modulated signal due to signal quality of the downstream channel. Although PAM4 enables optical network operators to pursue short haul 100 Gb/s transmission, it does create a penalty on signal to noise ratio (SNR). The distance for high signal quality becomes shorter, e.g. in the realm of distances up to 10 km. Since the ONUs 130 have varying distances from the OLT 110, the ONUs 130 receive varying signal qualities of the downstream signal 200. In addition, receivers configured for PAM4 modulated signals are more sensitive to jitter and inter-symbol interference (ISI) as compared to NRZ receivers, and this sensitivity is exacerbated when bandwidth limited components and receiver side equalization are employed. Thus, some advanced ONUs 130b capable of receiving PAM4 modulation may still not be able to decode the PAM4 downstream signal due to jitter, ISI, or other signal quality problems.

In general, the PON standards have been designed to ensure that an optical network unit (ONU) operating under the maximum path loss and dispersion can still meet the performance requirements. Until now, design for the channel conditions of individual ONUs 130 has not been specifically considered. In an embodiment, the PON system determines the channel and operating conditions of individual ONUs 130. The PON system then assigns a first portion of the downstream signal with a first lower bit rate modulation to legacy ONUs 130a and/or advanced ONUs 130b that receive a low quality downstream signal. The PON system may then assign advanced ONUs 130b that operate under more benign channel conditions with a second portion of the downstream signal having a second higher bit rate modulation with a higher throughput capability.

In an embodiment, the second modulation having a higher throughput capability includes a multilevel amplitude modulation with adaptations to one or more amplitude transitions. For example, in one or more embodiments described herein, a modified 4-level pulse amplitude modulation (PAM4) is generated and employed to modulate the downstream signal 200. The modified PAM4 encodes the data bits in the downstream signal such that a probability of one or more predetermined transitions between one or more amplitude levels (e.g., transitions between one or more of the four amplitude levels) are modified. This adaptation of the probability of predetermined transitions is configured to assist legacy ONUs 130a (e.g., configured for NRZ modulated signals) in clock recovery of the downstream signal. In addition, the modified PAM4 helps advanced ONUs 130b achieve a stable clock and data recovery (CDR) and equalizer performance by enhancing jitter and ISI tolerance. The modified PAM4 may increase a probability of one or more predetermined transitions and/or decrease the probability of one or more transitions. This adaptation of the probability of one or more transitions between levels may be termed "probabilistic transition shaping." By selecting between the lower bit rate modulation (such as NRZ) and the modified PAM4 format, the PON may adapt the information rate transmitted to the ONUs. For example, the ONUs 130 may be assigned frames in the downstream signal that are modulated with NRZ or modulated with modified PAM4. The selection may be based on one or more of: ONU capability, signal quality of the received downstream signal, link budget, subscriber status or other factors. The modulation format and information rate may thus be selected per ONU.

Figure 4A:
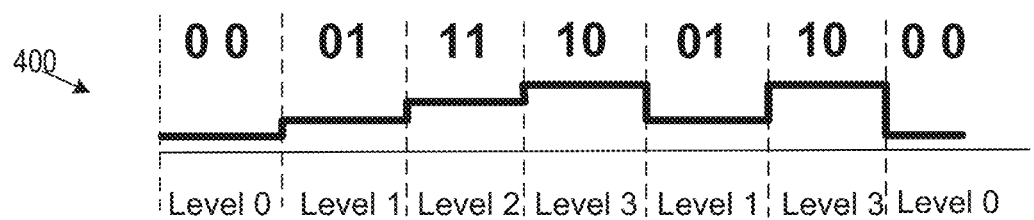
FIG. 4A illustrates a schematic diagram of an embodiment of a conventional PAM4 modulation.

FIG. 4A illustrates an embodiment of a signal 400 with a conventional PAM4 format 400. The conventional PAM4 modulation is a four-level pulse amplitude modulation that combines two bits into a single symbol. The information rate for the conventional PAM4 is thus 2 bits per symbol. As seen in FIG. 4A, the four amplitude levels in the conventional PAM4 modulation have the following example associated data bits (assuming Gray mapping is employed). Level 0 is associated with data bits 00, level 1 is associated with data bits 01, level 2 is associated with data bits 11, and level 3 is associated with data bits 10. The symbols in conventional PAM4 modulation are each associated with two data bits. Thus, conventional PAM4 has a rate of 2 bits per symbol.

Figure 4B:
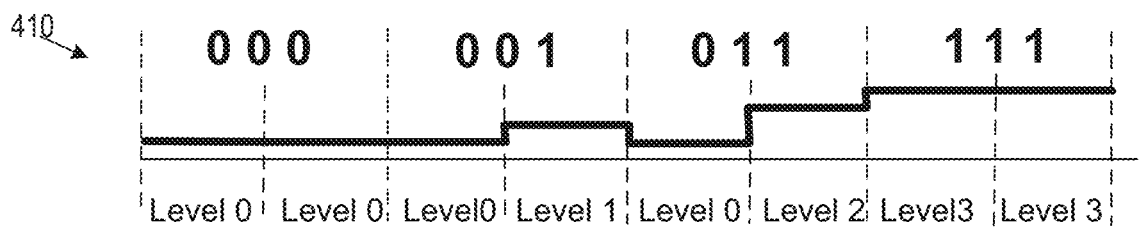
FIG. 4B illustrates a schematic diagram of an embodiment of a modified PAM4 modulation.

FIG. 4B illustrates an embodiment of signal 410 with a modified PAM4 format. In an embodiment, the modified PAM4 format encodes three data bits over two symbols. The information rate for this modified PAM4 is reduced to 1.5 bits per symbol. This reduction in bits/symbol rate means that not all the symbol patterns with a length L=2 are needed. The three data bits include $2^3$=8 unique bit sequences, thus requiring only 8 symbol patterns to encode the 8 unique bit sequences. A PAM4 symbol pattern of length L=2 has a total of $4^2$=16 symbol patterns. Thus, more symbol patterns are available than are needed for mapping the 8 unique sequences of data bits. This disparity enables a deletion of one or more of the 16 symbol patterns.

In an embodiment, symbol patterns including undesirable transitions between amplitude levels may be deleted, e.g. not used in the mapping of the 8 unique bit sequences. This selection of the valid symbol patterns allows a modification of a probability of predetermined transitions between amplitude levels, as described in more detail herein. The modified PAM4 modulation thus modifies or adapts the probability of predetermined transitions between amplitude levels in the downstream signal.

Figure 4C:
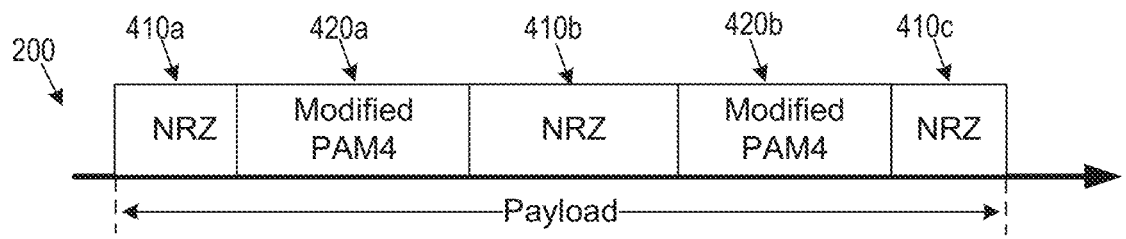
FIG. 4C illustrates an embodiment of a downstream signal with multimodulation in a PON.

FIG. 4C illustrates an embodiment of a downstream signal 200 with multimodulation in a PON. In this embodiment, the OLT 110 interleaves NRZ modulated portions 410a-c and modified PAM4 portions (e.g., PAM4 with probabilistic transition shaping) 420a-b on the same wavelength in the downstream signal 200. The modulated portions 410a-b, 420a-c may have different durations depending on scheduling and usage by the various legacy and advanced ONUs. Thus, adaptation of the information rate may be achieved by assigning NRZ or modified PAM4 formatted signal to an ONU. Also, as described above, the modified PAM4 portions 420a-b may still include headers modulated with NRZ so that legacy ONUs may determine the destination of the frames.

Figure 4D:
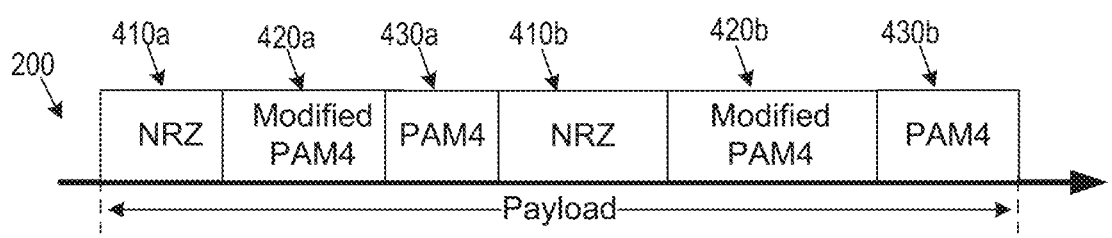
FIG. 4D illustrates another embodiment of a downstream signal with multimodulation in a PON.

FIG. 4D illustrates another embodiment of a downstream signal 200 with multimodulation in a PON. In this embodiment, the OLT 110 interleaves NRZ portions 410a, 410b and modified PAM4 modulated portions 420a, 420b and conventional PAM4 portions 430a, 430b on the same wavelength in the downstream signal 200. The downstream signal 200 may thus include three or more modulation formats which allows for further adaptation of the information rate by assigning NRZ or modified PAM4 or conventional PAM4 formatted signal to an ONU.

Figure 4E:
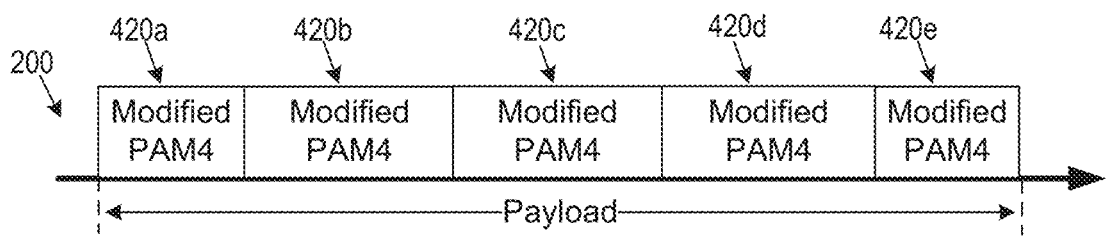
FIG. 4E illustrates an embodiment of a downstream signal with modified PAM4 in a PON.

FIG. 4E illustrates another embodiment of a downstream signal 200 with modified PAM4 in a PON. In this embodiment, the OLT 110 transmits the downstream signal 200 using only modified PAM4 portions 420a-d. Thus, the downstream signal 200 may only include a modified PAM4 format.

In another embodiment, modified PAM4 formats having different information rates may be implemented in the downstream signal 200. For example, the information rate for the modified PAM4 in portions 420a, 420c may be 1.5 bits per symbol (e.g., three bits encoded over two symbols). While the information rate for the modified PAM4 in portions 420b, 420d may be 1.75 bits per symbol (e.g., 7 bits encoded over 4 symbols). In another example, the information rate for one or more of portions 410 may be 1.25 (e.g., 5 bits encoded over 4 symbols). So adaptation of the information rate may be achieved by encoding different number of N data bits over L symbols in a modified PAM4 format. The examples in FIG. 4 describe a modified PAM4 modulation with probabilistic transition shaping. However, probabilistic transition shaping as described herein may be applied to other PAMx formats, wherein x is the number of amplitude levels and is greater than 2. In addition, probabilistic transition shaping may be applied to other types of modulation, as described in more detail below. The application of probabilistic transition shaping to the PAM4 format is used herein only as an example for illustrative purposes.

Figure 5:
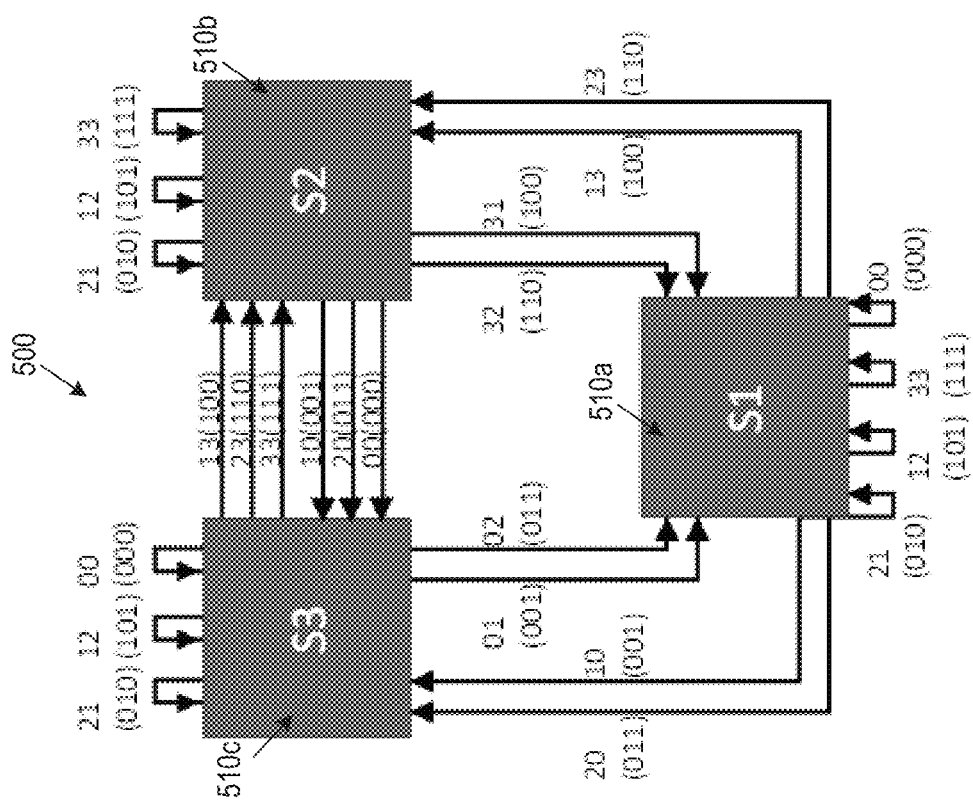
FIG. 5 illustrates an embodiment of an encoder to generate a modified PAM4 signal.

FIG. 5 illustrates an embodiment of an encoder 500 to generate a modified PAM4 signal with probabilistic transition shaping. In a first embodiment, the encoder 500 includes at least one state machine having a plurality of states 510a, 510b, 510c that encodes data bits to adapt the transitions in the modified PAM4 signal and encode the data to adapt the information rate. In an embodiment, the encoder 500 encodes the data bits over symbols such that certain transitions between amplitude levels are either decreased or increased. The modified PAM4 modulation thus modifies the probability of predetermined transitions between amplitude levels in the downstream signal.

In this specific example, the encoder 500 performs transition tuning encoding based on a 3-state machine (state S1, S2, and S3). In specific, the modified PAM4 encodes N=3 data bits over L=2 symbols. As such, the information rate in the modified PAM4 modulation is reduced to 1.5 bits per symbol (e.g. less than 2 bits per symbol in conventional PAM4 modulation). The encoding of three bits over two PAM4 symbols allows the probability of certain transitions between amplitude levels to be decreased or increased. For example, the probability of the transition from level 0 to level 3 is decreased in this modified PAM4 format. Similarly, the probability of the transition from level 3 to level 0 is lowered in this modified PAM4 format. In addition, the probability of transition between level 0 and level 0 is increased as well as the probability between level 3 and level 3. In other embodiments, the probabilities of transitions between additional or alternate amplitude levels may be adapted.

Figure 6:
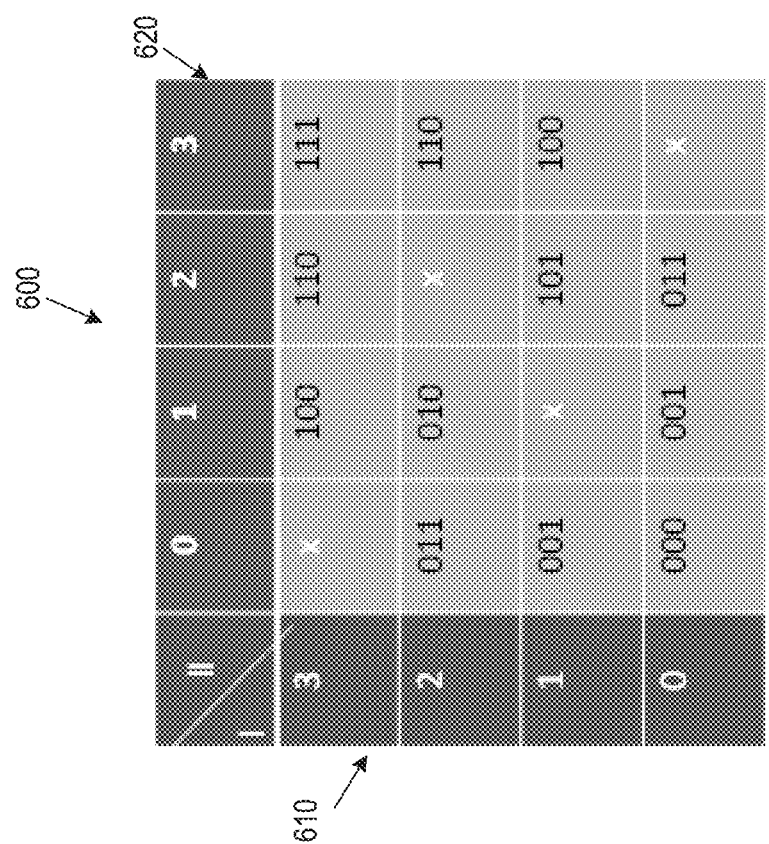
FIG. 6 illustrates an embodiment of a decoder to decode a modified PAM4 signal.

FIG. 6 illustrates an embodiment of a decoder 600 to decode a modified PAM4 signal. The first column 610 lists an amplitude level of a first symbol and the first row 620 lists an amplitude level of a second symbol in the modified PAM4 signal. Some symbol patterns are valid and included in the mapping. For example, the valid symbol patterns are mapped to three data bits as seen in FIG. 6. However, some symbol patterns are not included in the mapping in the modified PAM4 format. The x's indicate these symbol patterns that are not valid and not transmitted.

For example, when a first amplitude level is 0 and the second amplitude level is 0, then the associated or mapped data bits are 000. When a first amplitude level is 1 and the second amplitude level is 0, then the mapped data bits are 001. When a first amplitude level is 2 and the second amplitude level is 0, then the mapped data bits are 011.

However, note that no mapping is provided when a first amplitude level is 3 and the second amplitude level is 0. So this symbol pattern (e.g., amplitude level 3 to amplitude level 0) is not selected for mapping and is not transmitted as one of the mapped symbol patterns. This mapping thus reduces the probability of a level 3 to level 0 transition in a modified PAM4 signal.

Note that similarly, no mapping is provided when a first amplitude level is 0 and the second amplitude level is 3. So this symbol pattern (e.g., amplitude level 0 to amplitude level 3) is not selected in a modified PAM4 mapping and is not transmitted as one of the mapped symbol patterns. This encoding thus reduces the probability of a level 0 to level 3 transition in a modified PAM4 signal. The encoding in this exemplary modified PAM4 format thus reduces the probability of the following transitions between amplitude levels: between level 3 and level 0 and between level 0 and level 3.

In an embodiment, the modified PAM4 format also increases the probability of the following transitions between amplitude levels: between level 0 and level 0 and between level 3 and level 3. In this embodiment, the state machine with the plurality of states 510 determines the terminating symbol ($S_T$) of the preceding symbol pattern. When the terminating symbol is a level 0, the state machine tries to encode a symbol pattern beginning with a level 0. For example, from FIG. 6, the data bits 000 are mapped to a symbol pattern of level 0, level 0. The terminating symbol of the symbol pattern is thus level 0. Suppose the next data bits for mapping are 001. These data bits 001 are mapped to two valid symbol patterns in FIG. 6, e.g. the first symbol pattern is level 0, level 1 and the second pattern is level 1, level 0. The encoder 500 must decide between these two symbol patterns. Since the previous terminating symbol is a level 0, then the encoder 500 selects the first symbol pattern of level 0, level 1. The encoder 500 thus selects the symbol pattern having an initial symbol $S_I$ that is the same amplitude level of the terminating symbol $S_T$ of the preceding symbol pattern. This mapping of data bits based on the terminating symbol $S_T$ and initial symbol $S_I$ of consecutive symbol patterns increases the probability of transitions between level 0 to level 0.

The encoder 500 performs a similar process when the previous terminating symbol is a level 3. The state machine tries to encode a next symbol pattern beginning with a level 3. For example, from FIG. 6, the data bits 110 are mapped to a symbol pattern of level 2, level 3. The terminating symbol $S_T$ of the symbol pattern is thus level 3. Suppose the next data bits for mapping are 110. These data bits 110 are mapped to two valid symbol patterns in FIG. 6, e.g. the first symbol pattern is level 2, level 3 and the second pattern is level 3, level 2. Since the previous terminating symbol ST is a level 3, then the encoder 500 selects the second symbol pattern of level 3, level 2. This mapping and encoding increases the probability of transitions between level 3 to level 3.

Figure 7:
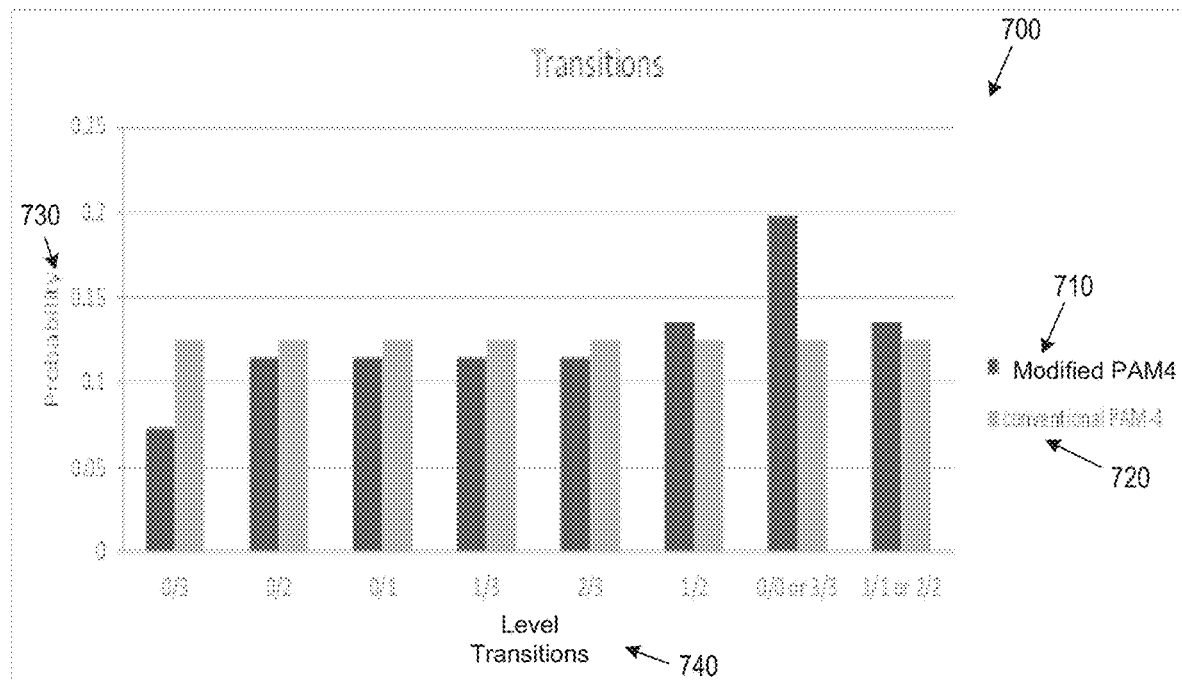
FIG. 7 illustrates a graphical representation of probability of transitions between levels in a modified PAM4 signal and in a conventional PAM4 signal.

FIG. 7 illustrates a graphical representation 700 of probability of transitions between levels in this example of the modified PAM4 710 and in conventional PAM4 720. The vertical axis represents the probability 730 of level transitions 740 shown on the horizontal axis. As seen in the graph, the level transitions in conventional PAM4 720 have the same probability. In theory, the level transitions in conventional PAM4 720 are exactly equal when random equiprobable data is assumed, however there may be some variance in simulations or in the field, especially if considered over a short duration. However, in general over time, the transitions between amplitude levels in conventional PAM4 720 should have approximately the same probability and theoretically have the same probability.

In contrast, in this example of modified PAM4 710, the probability 730 of level transitions 740 between the outermost levels 0 and 3 (e.g. 0 to 3 or 3 to 0), in this example of modified PAM4 710 is theoretically lowered from 12.5% to 7.5%. The lowered theoretical probability is less than the theoretical probability of other level transitions in modified PAM4 710. For example, the probability 730 of level transitions 740 between the outermost levels 0 and 3 in modified PAM4 710 (e.g., 7.5%) is less than the probability of the transition between 0 and 2 (e.g., 12%) or between 0 and 0 (e.g., 20%) in modified PAM4 710. In addition, the decreased probability 730 of level transitions 740 between the outermost levels 0 and 3 in modified PAM4 (e.g., 7.5%) is less than the probability of the same level transition between the outermost levels in 0 and 3 in conventional PAM4 (e.g., 12.5%).

The "probability of a level transition" as used herein means the theoretical probability and the probability in practice or in operation, e.g. when random equiprobable data is assumed of a level transition. The "decreased probability of a level transition" in modified PAM4 means that the probability of a level transition is less than the probability of the same level transition in a conventional PAM4 720. The "decreased probability of a level transition" in modified PAM4 also means that it has a lower probability of one or more other level transitions in modified PAM4.

In another example, the probability 730 of level transitions 740 between level 3 and level 3 (e.g., 20%) is greater in modified PAM4 710 than the probability of other level transitions in modified PAM4 710. In specific, the probability 730 of level transitions 740 between the level 3 and level 3 in modified PAM4 is greater than the probability of transitions between 0 and 2 or between 0 and 3 in modified PAM4. In addition, the probability in modified PAM4 of the level transition between level 3 and level 3 (e.g., 20%) is greater than the probability of the same level transition between level 3 and level 3 in conventional PAM4 720 (e.g., 12.5%).

In a still further example, the probability 730 of level transitions 740 between level 0 and level 0 (e.g., 20%) is greater than the probability of other level transitions in modified PAM4 710. In specific, the probability 730 of level transitions 740 between the outermost levels 0 and 0 (e.g., 20%) is greater than the probability 730 of level transitions 740 between 0 and 2 or between 0 and 3. In addition, the probability in modified PAM4 of the level transition between level 0 and level 0 (e.g., 20%) is greater than the probability of the same level transition between level 0 and level 0 in conventional PAM4 720 (e.g., 12.5%). The "increased probability of a level transition" in modified PAM4 means that the probability of the level transition is greater than the probability of the same level transition in a conventional PAM4 720. The "increased probability of a level transition" in modified PAM4 also means that it has a greater probability of one or more other level transitions in modified PAM4.

The probabilistic transition shaping of PAM4 modulation thus adapts (e.g., increases or decreases) the probability of at least one predetermined level transition between one or more amplitude levels. For example, the probability of at least one level transition in modified PAM4 is greater than the probability of other level transitions in modified PAM4 and/or greater than the probability of the same at least one level transition in conventional PAM4. In addition or alternatively, in modified PAM4, the probability of at least one level transition is less than the probability of one or more other level transitions in PAM4, and less than the probability of the same at least one level transitions in conventional PAM4. This adaptation of the probabilities of level transitions may assist to stabilize CDR and equalizer performance in the ONUs 130 and to enhance jitter and ISI tolerance.

Figure 8:
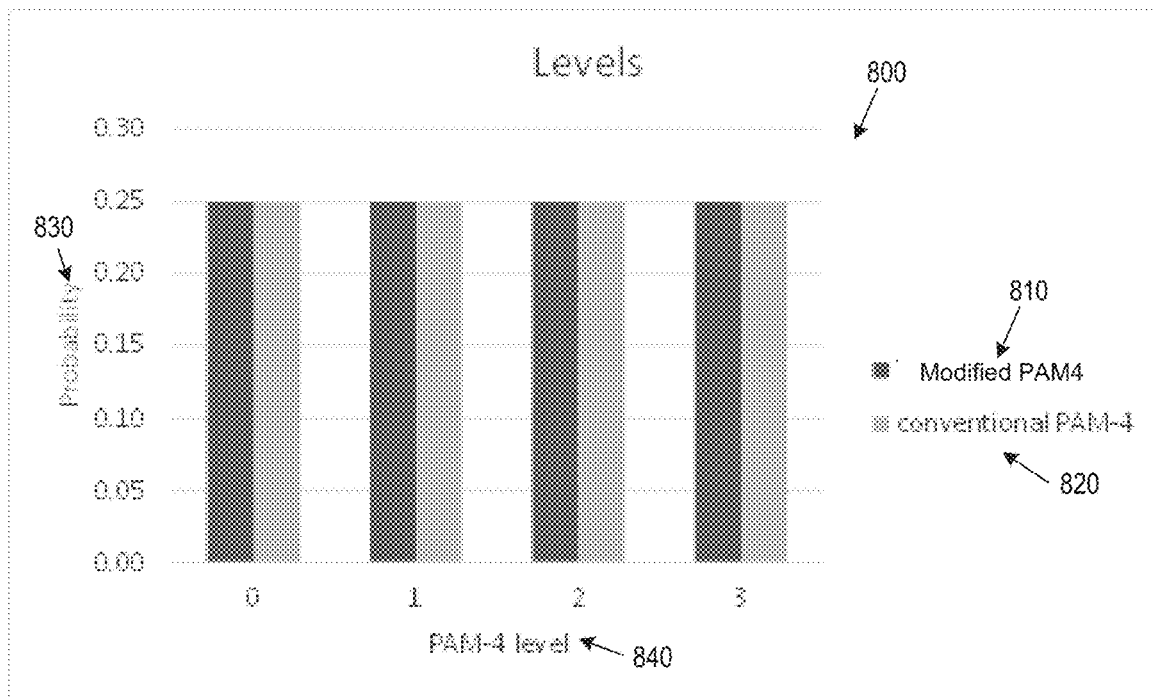
FIG. 8 illustrates a graphical representation of probability of amplitude levels in a modified PAM4 signal and in a conventional PAM4 signal.

FIG. 8 illustrates a graphical representation 800 of probability of levels in modified PAM4 810 and in conventional PAM4 820. The vertical axis corresponds to the probability 830 of a level while the horizontal axis corresponds to a PAM4 level 840. The graph illustrates that in this embodiment with a state machine, the probabilities of the levels (e.g., 25%) are uniform in both modified PAM4 810 and in conventional PAM4 820. In this embodiment of modified PAM4, the probabilities of level transitions (shown in FIG. 7) are adapted but the probabilities of the levels (shown in FIG. 8) are not adapted, e.g. probabilistic level shaping is not implemented.

In another embodiment, probabilistic level shaping may also be implemented as well as probabilistic transition shaping to generate a modified PAM4 signal. This implementation of both probabilistic level shaping and transition shaping may further optimize the performance of the ONUs 130.

The modified PAM4 format in this embodiment maps 3 bits over two PAM4 symbols to generate a 1.5 bit per symbol rate. In another embodiment of modified PAM4, 7 bits may be mapped over four PAM4 symbols to provide a 1.75 bit per symbol rate. In yet another embodiment of modified PAM4, 5 bits may be mapped over four PAM4 symbols to provide a 1.25 bit per symbol rate. When a lower symbol rate, or more states, bits, and/or more PAM4 symbols are used in the encoding, transition shaping and rate-adaptation may be extended further for optimizing reception of the downstream signal in a PON.

In another embodiment, the modified PAM4 modulation is encoded in the downstream signal using one or more codebooks or code mappings. The one or more codebooks include one or more databases that map the data bits to PAM4 symbol patterns in accordance with desired level transition probabilities. The encoding of the PAM4 signal with codebooks may control the level transitions in the downstream signal with more flexibility.

In one example, a modified PAM4 modulated signal has four amplitude levels {0, 1, 2, 3} with N bits mapped over symbol patterns with a length L. The code book is configured to exclude symbol patterns with transitions between the outermost levels, i.e., 0→3 and 3→0. In this embodiment, in order to lower complexity and to limit error propagation, symbol pattern lengths are chosen to span a small number, L, of PAM4 symbols, and the last symbol (called the terminating symbol $S_T$) in the span is constrained to transmit only two levels, for example, the outermost levels {0, 3}. Thus, valid symbol patterns include a terminating symbol $S_T$ of level 0 or level 3. In view of these constraints, the number of valid symbol patterns with a length L, and the number of data bits that can be transmitted over these valid symbol patterns with a length L are shown in FIG. 9.

Figure 9:
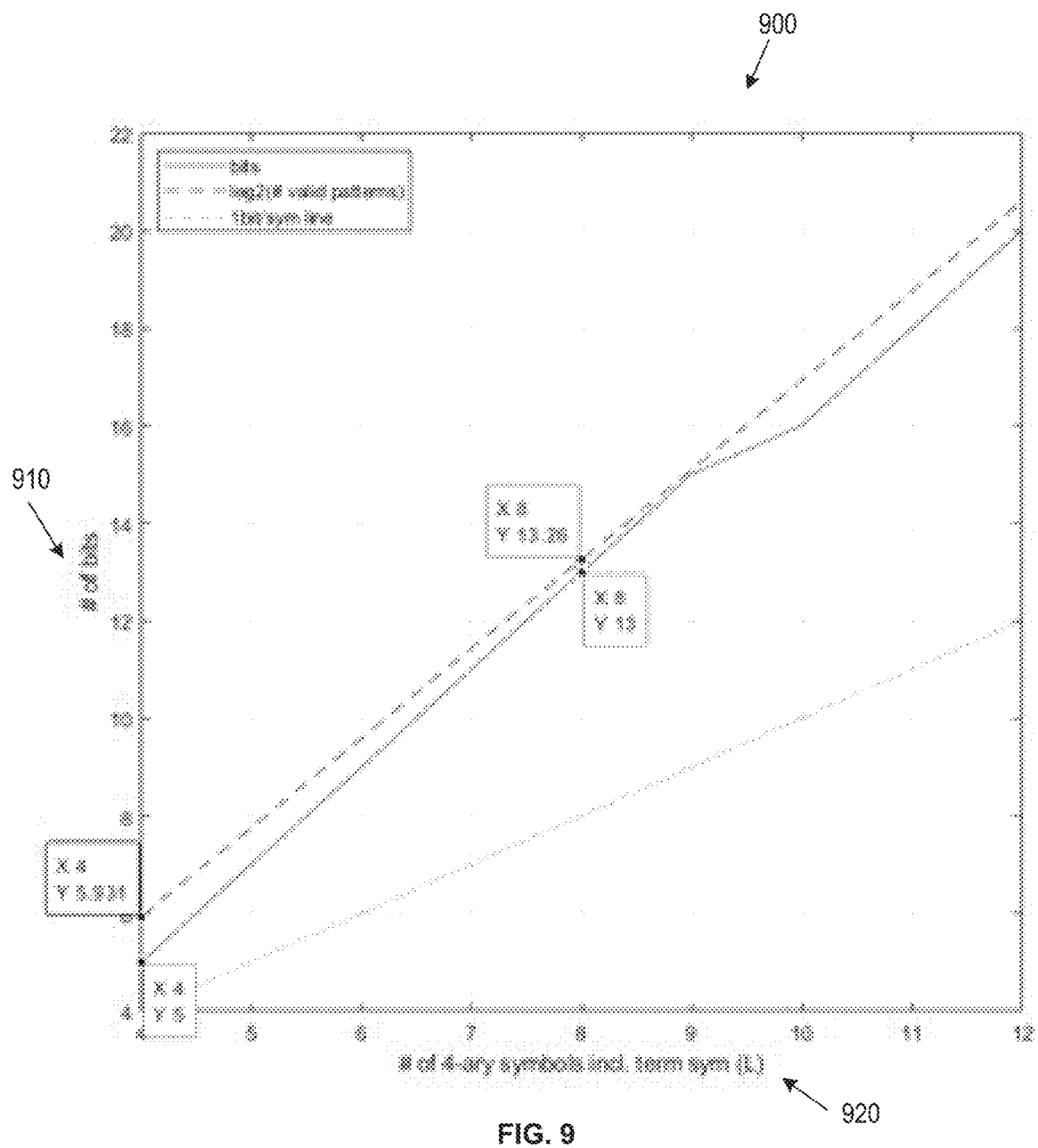
FIG. 9 illustrates a graphical representation of a number of valid patterns of PAM4 symbols and a number of bits that can be transmitted over L symbols.

FIG. 9 illustrates a graphical representation 900 of a number of valid symbol patterns with a length L and a number N of data bits that can be transmitted over these valid symbol patterns. The N data bits are mapped to symbol patterns with a length L, wherein N/L is less than 2. The graph 900 compares the number N of data bits 910 on the vertical axis that can be mapped to valid patterns of PAM4 (or other 4-ary) symbols of length (L) 920 on the horizontal axis. As seen in the graph 900, N=5 bits may be encoded over symbol patterns of length L=4 or a number N=13 bits may be encoded over symbol patterns of length L=8.

In the example of N=5 bits encoded over symbol patterns of length L=4 in a modified PAM4 format, the valid patterns of PAM4 symbols 920 exclude transitions between the outermost levels (e.g., 0→3 and 3→0 for PAM4) and terminate at the outermost levels (e.g. the terminating symbol is either 3 or 0 for PAM4). Though these guidelines are implemented to generate valid symbol patterns in this embodiment, other guidelines may be implemented alternatively or in addition to these guidelines.

For example, in an embodiment using PAM4, when the symbol patterns have a length L=4, then there 256 patterns (Lx, wherein L=4 and x=4 amplitude levels). Of these 256 patterns, there are 61 valid symbol patterns that do not contain 0→3 or 3→0 transitions, and that terminate either at the 0 or 3 level. The 61 valid patterns are illustrated in Table 1 below:

TABLE 1

| VALID PATTERNS for L = 4 | | | | | | | |
| --- | --- | --- | --- | --- | --- | --- | --- |
| 0000 | 0010 | 0020 | 0100 | 0110 | 0120 | 0200 | 0210 |
| 0220 | 1000 | 1010 | 1020 | 1100 | 1110 | 1120 | 1200 |
| 1210 | 1220 | 1310 | 1320 | 2000 | 2010 | 2020 | 2100 |
| 2110 | 2120 | 2200 | 2210 | 2220 | 2310 | 2320 | |
| 0013 | 0023 | 0113 | 0123 | 0133 | 0213 | 0223 | 0233 |
| 1013 | 1023 | 1113 | 1123 | 1133 | 1213 | 1223 | 1233 |
| 1313 | 1323 | 1333 | 2013 | 2023 | 2113 | 2123 | 2133 |
| 2213 | 2223 | 2233 | 2313 | 2323 | 2333 | | |

The first 31 patterns (shown in the first four rows in Table 1 above) terminate at the 0 level, while the remaining 30 patterns terminate at the 3 level. Rounding the log 2(N)=VP, wherein VP is the number of valid patterns (61) to the nearest smaller integer, then N=4 bits of information may be encoded. A subset of 2^4=16 patterns from the set of 61 valid patterns are needed for mapping, and thus the (61) patterns in Table 1 may be further refined using one or more guidelines.

In an embodiment, the following guidelines are used to select the valid symbol patterns and perform the mapping of the valid symbol patterns to data bits in the codebook database.

1. The number of symbol patterns terminating in the level 0 are selected to be equal to those terminating in the level 3. This guideline ensures that one of the bits (e.g., the MSB) can be used to select the terminating level with equal probability. This is also beneficial in determining a 'complementary codebook' for the case where the previously transmitted symbol is a level 3.
2. For a given terminating level, the patterns may be partitioned into two equal sized groups; one where the first symbol is 0 and another where the first symbol is not zero. In this case, since at least 8 patterns starting with 0 exist for both terminating levels, one bit can be used to make this selection.
3. Alternatively, symbol patterns in the codebook may be selected to maximize Euclidean distance. Note that most patterns are at an Euclidean distance of at least 2 with respect to others, but there are still a few patterns at Euclidean distance 1 with respect to other patterns.
4. Construct a complementary codebook that is used when the previously transmitted symbol is a 3 (e.g. instead of a 0). The symbol patterns may be constructed using a mirrored mapping scheme, i.e., where the level i from the codebook is replaced with the value 3—i in the complementary codebook.

Steps 1 and 4 ensure a symmetric distribution of levels. In an embodiment, a codebook database stores the mapping of the valid symbol patterns to the data bits. An exemplary codebook and complementary codebook for symbol patterns of length L=4 encoding a number of N=5 data bits for a modulated PAM4 format is shown in FIG. 10.

FIG. 10 illustrates an embodiment of a codebook database for encoding and decoding a modified PAM4 signal, wherein N=5 data bits are encoded per symbol pattern of length L=4. A codebook 1020 illustrates encoding for the N data bits

1010 when the last previously transmitted PAM4 symbol is a level 0. The complementary codebook 1030 illustrates the encoding for the N data bits 1010 when the previously transmitted PAM4 symbol is a level 3. This encoding by the codebook 1020 and the complementary codebook 1030 restricts the transitions between the outermost symbol levels, e.g. between levels 0 to 3 and between levels 3 to 0 in a modified PAM4 signal. Note that the adaptation of the probability of these transitions between amplitude levels is exemplary, and other transitions between other amplitude levels may be implemented alternatively or in addition thereto.

Figure 11:
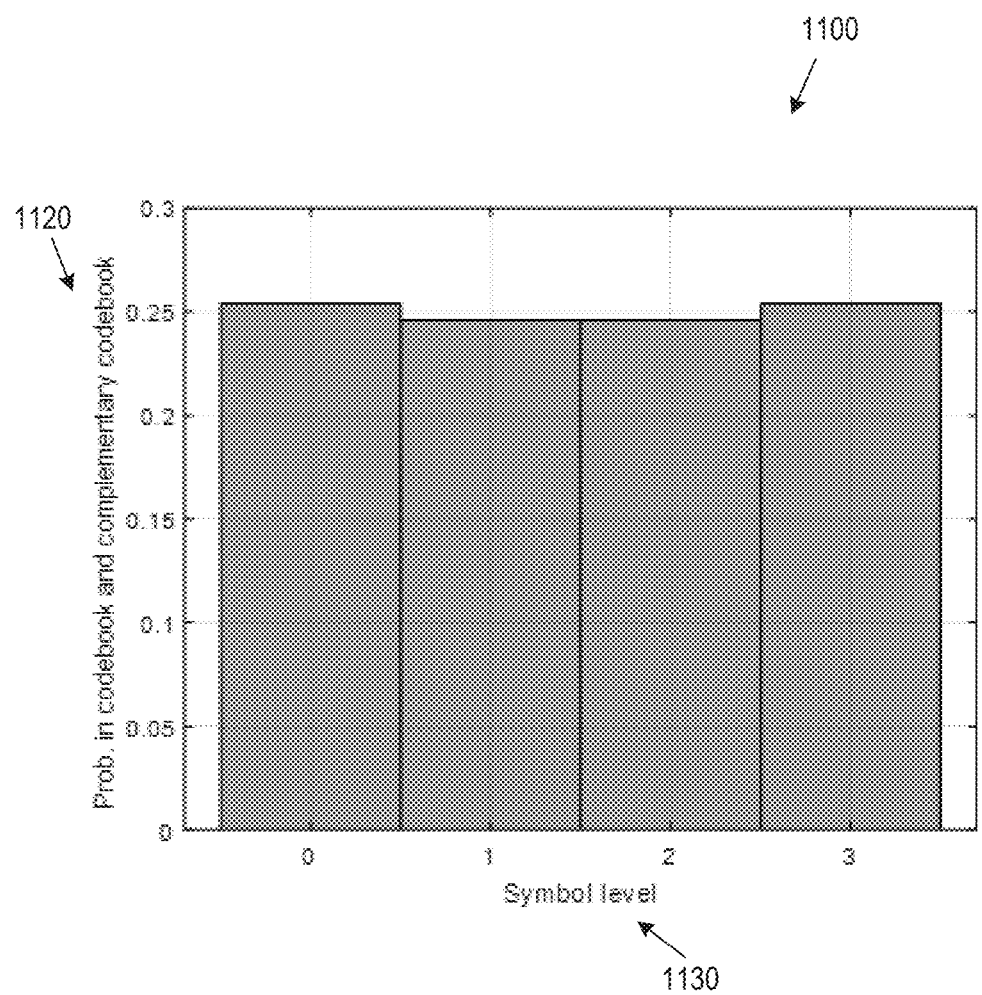
FIG. 11 illustrates a graphical representation of a probability of amplitude levels in a codebook and a complementary codebook of FIG. 10.

FIG. 11 illustrates a graphical representation 1100 of the resulting probability of the symbol levels 1120 with the codebook and complementary codebook shown in FIG. 10. The horizontal axis illustrates the symbol levels {0, 1, 2, 3} 1130 of the PAM4 modulation, and the vertical axis shows the probability of the symbol level 1120 in this embodiment of the codebook and complementary codebook. Almost or approximately equal probabilities (e.g., approximately 25%) are achieved across the four levels. However, there is a minimal difference in the probabilities of the levels in this embodiment of the codebooks. This difference results in an insignificant or minimal amount of probabilistic level shaping. In other embodiments of the codebooks, a different probability distribution of the levels may be achieved by a different selection of valid patterns. For example, an equal distribution of probabilities of the levels may be achieved through a different selection of the valid patterns in the codebooks from the example in FIG. 11. In another embodiment, a statistically significant or meaningful probabilistic level shaping may be achieved as well as probabilistic transition shaping through selection of the valid patterns in the codebooks. This implementation of both probabilistic level shaping and transition shaping may further optimize the performance of the ONUs 130.

Though the symbol pattern length L=4 and number of bits=5 in this example, other lengths L of symbol patterns may be encoded. For example, as shown in FIG. 9, a number N=13 data bits may be encoded across PAM4 symbol patterns of length L=8. As shown in FIG. 6, when the symbol pattern length L=2, then N=3 data bits may be encoded. The information rate may thus be adapted in the modified PAM4 signal by implementing a plurality of different mappings, wherein the mappings include different symbol rates N/L.

The application of probabilistic transition shaping to the PAM4 format is used herein only as an example for illustrative purposes. The probabilistic transition shaping may be applied to other PAMx formats, wherein x is the number of amplitude levels and x is greater than 2. For example, probabilistic transition shaping may be applied to PAM8 or to PAM3.

Figure 12A:
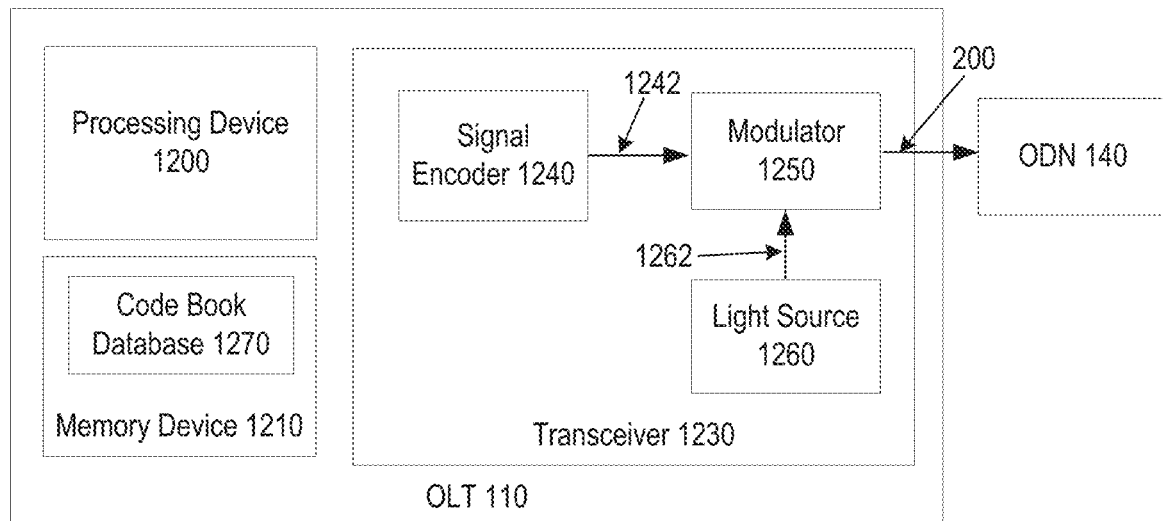
FIG. 12A illustrates a schematic diagram of an embodiment of an OLT configured to generate a modified PAMx signal using a codebook database.

FIG. 12A illustrates a schematic diagram of an embodiment of the OLT 110 configured to generate a modified PAMx signal using a code book database. The OLT includes a processing device 1200 with one or more processors and a memory device 1210. The memory device 1210 includes a non-transitory computer readable storage medium that stores one or more sets of executable instructions that when executed by the one or more processors causes the OLT 110 to perform one or more aspects of the embodiments described herein. The memory device may include, any storage medium, or combination of storage media, accessible by the OLT 110 during use to provide instructions and/or data to the OLT 110. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the OLT 110 (e.g., system RAM or ROM), fixedly attached to the OLT 110 (e.g., a magnetic hard drive), removably attached to the OLT 110 (e.g., an optical disc or Universal Serial Bus (USB)-based Flash memory), or coupled to the OLT 110 via a wired or wireless network (e.g., network accessible storage (NAS)).

The OLT 110 further includes a transmitter/receiver (transceiver) 1230 including at least one signal encoder 1240 and modulator 1250. The signal encoder 1240 generates a digital encoding signal 1242, wherein the data bits are mapped to an amplitude modulated signal with probabilistic transition shaping as described herein. In an embodiment, the signal encoder 1240 encodes two or more modulations formats, such as a modified PAMx with probabilistic transition shaping, another AM format with probabilistic transition shaping, conventional PAMx, and/or NRZ. The one or more different modulations are interleaved in one or more portions on a same wavelength. The portions may have fixed or variable durations and be based on one or more frames or on fixed or variable time windows.

The modulator 1250 uses the digital encoding signal 1242 to modulate an optical carrier signal 1262 from a laser light source 1260. The transceiver 1230 may thus generate a downstream signal with multimodulation, e.g., wherein at least a first portion of the downstream signal is modulated using a first modulation format and at least a second portion is modulated using a modified amplitude modulation format with probabilistic transition shaping. In another embodiment, the transceiver 1230 may generate a downstream signal including only an amplitude modulation format with probabilistic transition shaping.

The modulator 1250 and laser light source 1250 may include a directly modulated laser diode (DML) or an integrated laser diode with an electro-absorption modulator (EAM) in a single integrated circuit (EML). The modulated optical carrier signal is transmitted from the OLT 110 as the downstream signal 200 to the optical distribution network (ODN) 140.

In an embodiment, the OLT 110 stores a code book database 1270 in the memory device 1210. The codebook database 1270 includes one or more codebooks and complementary codebooks. Each of the codebook and complementary codebook includes a mapping of a predetermined number N of data bits to symbol patterns with a predetermined length L. The codebook provides the mapping when the previously transmitted PAMx symbol is a first outermost level (such as level 0 for PAM4 or PAM8) and the complementary codebook stores the mapping when the previously transmitted PAMx symbol is a second outermost level (such as level 3 for PAM4 or level 7 for PAM8).

The signal encoder 1240 uses the code book database 1270 to map the data bits to a valid pattern of symbols as described herein. The mapped symbols and the pre-computed sequences are output as the digital encoded signal 1242 and are uploaded to the modulator 1250. The modulator 1250 may include a memory and CMOS digital to analog converter (DAC) for high speed modulation of the optical carrier signal 1262.

Another objective of using multiple modulation formats on the downstream signal 200 is the ability to assign different line rates per ONU 130. The assignment may be performed in response to one or more parameters, such as link budget, ONU capability, signal quality at the ONU, subscriber status, etc. The OLT 110 transmits an assignment of a modulation format to the ONU 130.

Figure 12B:
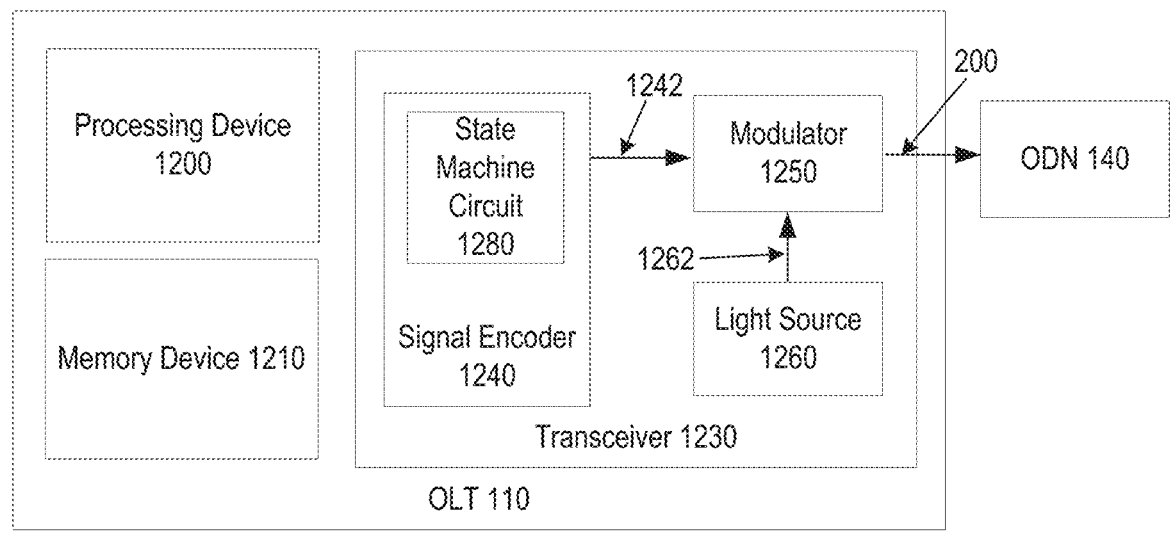
FIG. 12B illustrates a schematic diagram of another embodiment of an OLT configured to generate a modified PAMx signal using at least one state machine with a plurality of states.

FIG. 12B illustrates a schematic diagram of an embodiment of the OLT 110 configured to generate a modified PAMx signal using a state machine with one or more states. The OLT 110 includes a state machine circuit 1280 including at least one state machine with a plurality of states 510, e.g. as described with respect to FIG. 5. The signal encoder 1240 employs the state machine circuit 1280 to map N data bits to a valid pattern of symbols of length L.

In another embodiment, the OLT 110 may implement both a code book database 1270 and state machine circuit 1280, wherein the devices work independently. Alternatively, the OLT 100 may use both in combination to map the data bits to a valid pattern of PAMx symbols.

Figure 13A:
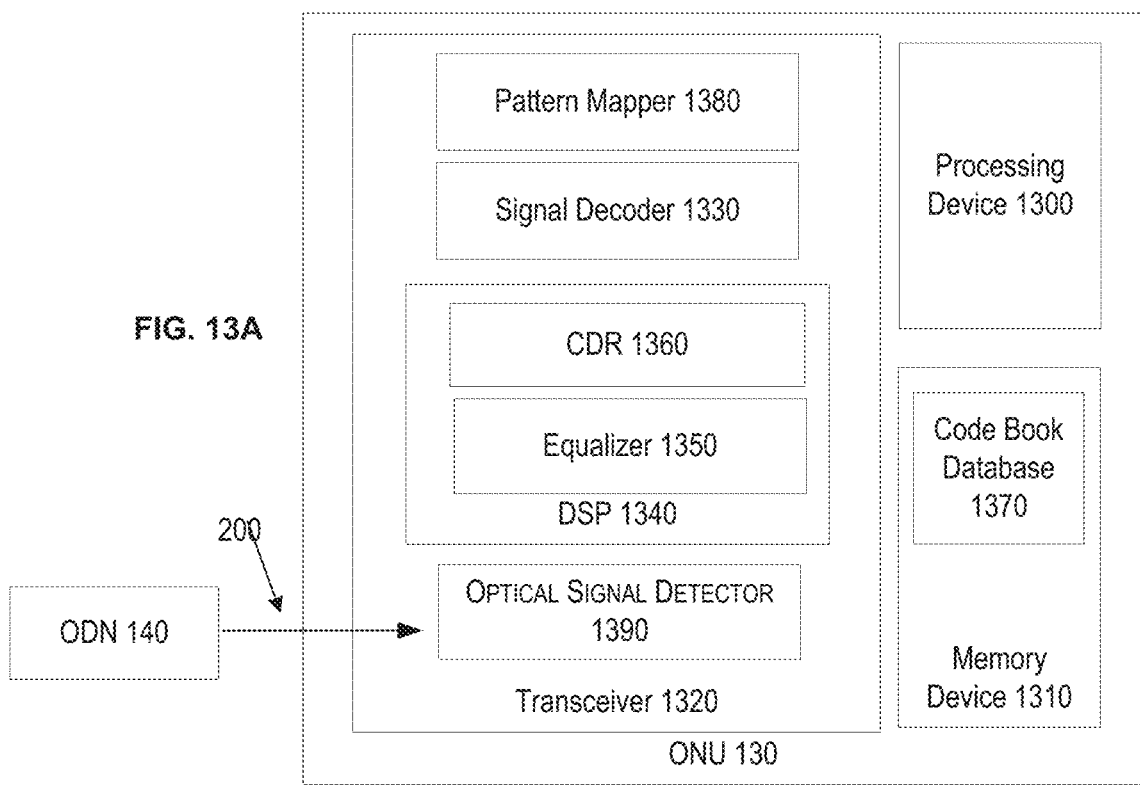
FIG. 13A illustrates a schematic diagram of an embodiment of an ONU configured to decode a modified PAMx signal using a code book database.

FIG. 13A illustrates a schematic diagram of an embodiment of the ONU 130 using a code book database to decode a modified PAMx downstream signal 200. The ONU 130 includes a processing device 1300 with one or more processors and a memory device 1310. The memory device 1310 includes a non-transitory computer readable storage medium that stores one or more sets of executable instructions that when executed by the one or more processors causes the ONU 130 to perform one or more aspects of the embodiments described herein. The memory device 1310 may include, any storage medium, or combination of storage media, accessible by the ONU 130 during use to provide instructions and/or data to the ONU 130. Such storage media may include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the ONU 130 (e.g., system RAM or ROM), fixedly attached to the ONU 130 (e.g., a magnetic hard drive), removably attached to the ONU 130 (e.g., an optical disc or Universal Serial Bus (USB)-based Flash memory), or coupled to the ONU 130 via a wired or wireless network (e.g., network accessible storage (NAS)).

The ONU 130 further includes a transmitter/receiver (transceiver) 1320 including an optical signal detector 1390 including at least one photodiode and an analog to digital convertor. For next generation high speed PON of 50 Gb/s and above line rates, the ONU transceiver 1320 may include a digital signal processing (DSP) 1340. The DSP 1340 includes an equalizer 1350 (such as a feedforward and decision feedback equalizer (FFE/DFE)) and clock and data recovery circuit (CDR) 1360. In high speed PON, there is substantial inter symbol interference (ISI) due to components' limited bandwidth, fiber dispersion and transmitter chirp. The DSP 1340 helps to combat these problems to detect the modified PAMx symbols, especially when the downstream signal 200 has data rates of 50 Gb/s and above and has a multimodulation, e.g., of a modified PAMx with probabilistic transition shaping, another AM format with probabilistic transition shaping, conventional PAMx, and/or NRZ.

The clock and data recovery circuit 1360 is configured to perform clock recovery during periods when the downstream signal is modulated with a PAMx format and during periods when modulated with the NRZ format. When assigned frames with PAMx modulation, the CDR 1360 and/or signal decoder 1330 decodes its designated data from detected PAMx symbols. When assigned frames with NRZ modulation, the CDR 1360 and/or signal decoder 1330 decodes its designated data from detected NRZ symbols.

In an embodiment, the signal decoder 1330 is configured to decode data from the detected modified PAMx symbols using the code book database 1370. The codebook database 1370 includes the same codebook and complementary codebook used by the OLT 110 to encode the PAMx symbols. The codebook and complementary codebook may be predefined (e.g., in a PON standard) or stored during configuration of the OLT 110 and ONU 130 or exchanged between the OLT 110 and ONU 130 using an established management channel.

At the ONU 130, when PAMx is implemented, standard PAMx decisioning may be used to detect the L-1 non-terminating symbols. When the terminating symbol is limited to the outermost levels (e.g., 0 or 3 for PAM4 and 0 or 7 for PAM8), then standard NRZ decisioning may be used to detect the terminating symbol.

A valid pattern for the detected block of L symbols is then determined. The level of the previous terminating symbol (e.g., the last symbol of the previous block of L symbols) is used to determine whether the codebook (previous symbol is level 0) or complementary codebook (previous symbol is level 3) should be selected for pattern-to-bit mapping.

In case the detected block of L symbols matches a valid pattern in the selected book (i.e., codebook or complementary codebook), an estimate of the transmitted bits may be determined directly from the selected codebook. In case the detected block of L symbols does not match a valid pattern in the selected book (codebook or complementary codebook), a pattern mapper unit 1380 may determine a valid pattern from the detected block of L symbols, e.g., determine a valid pattern that is nearest to the detected pattern in terms of Euclidean distance. Then, the transmitted bits may be determined directly from the selected codebook. When multiple valid patterns exist at the nearest Euclidean distance, the bits wherein the nearest neighbor patterns differ may be marked as erasures for further decoding using the forward error correction (FEC) data in the downstream signal 200.

Figure 13B:
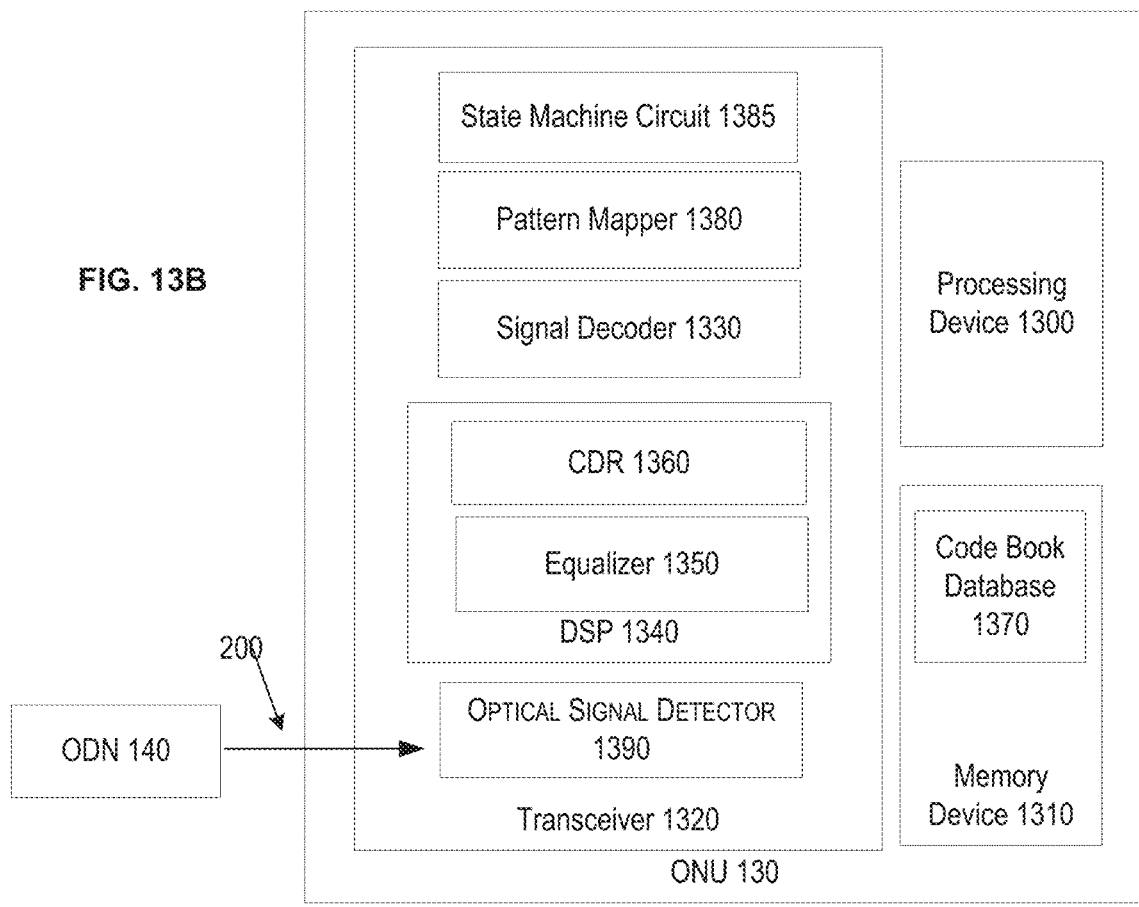
FIG. 13B illustrates a schematic diagram of another embodiment of an ONU using at least one state machine with a plurality of states to decode a modified PAMx downstream signal.

FIG. 13B illustrates a schematic diagram of another embodiment of the ONU 130 that implements at least one state machine with a plurality of states 510 to decode a modified PAMx downstream signal 200. In this embodiment, the ONU 130 includes a state machine circuit 1385 including at least one state machine with a plurality of states 510. The signal decoder 1330 is configured to decode data from the detected PAMx symbols using the state machine circuit 1380.

In another embodiment, the ONU 130 may implement both a code book database 1370 and a state machine circuit 1385, wherein the devices work independently. Alternatively, the ONU 130 may use both in combination to decode the modified PAMx downstream signal.

Figures 14A, 14B:
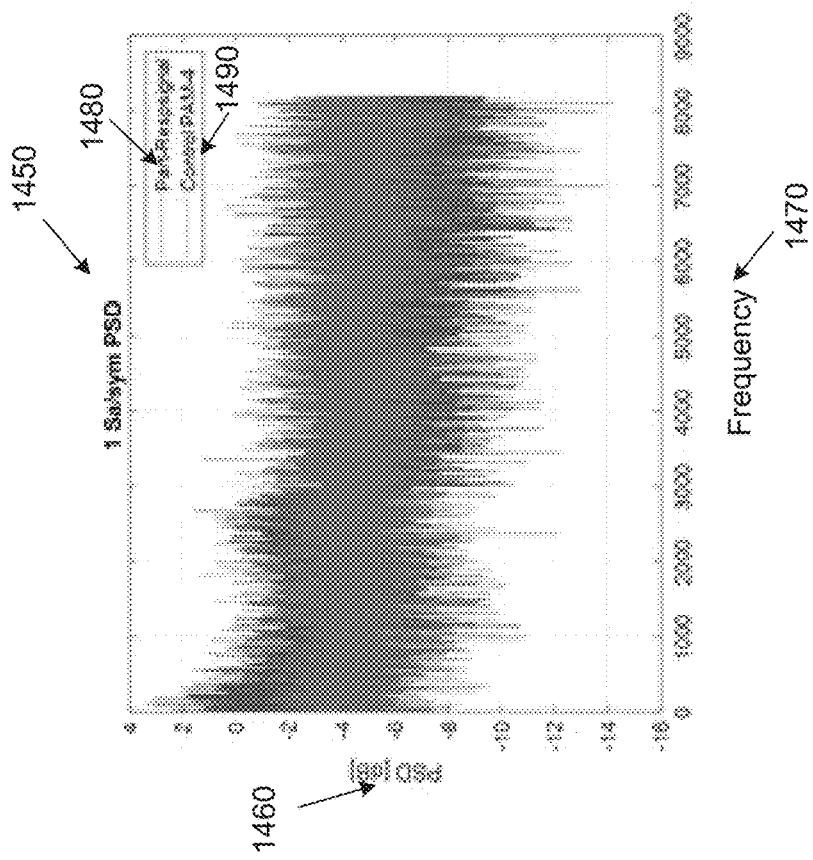
FIG. 14A illustrates an eye diagram of a modified PAM4 signal.
FIG. 14B illustrates a graph of power spectral density (PSD) of a modified PAM4 signal.

FIG. 14A illustrates an eye diagram 1400 of an optical signal modulated using the modified PAM4 format. In this embodiment, PAM4 symbols with a pattern length L=8 are mapped to N=13 bits in the codebook and complementary codebook. As seen in FIG. 9, there are a total of 9805 valid patterns ($\log 2(9805)=13.26$). The modified PAM4 codebook may thus map N=13 bits to a selection of 8192 patterns, e.g. that are a subset of the 9805 valid patterns.

The horizontal axis of the eye diagram 1400 illustrates the time 1410 over which the amplitude 1420 of the PAM4 symbols 1420 on the vertical axis are measured. The eye diagram is measured at 2 samples/symbol. The eye diagram 1400 illustrates that the absence of transitions between the outermost levels, e.g. between 0 to 3 and between 3 to 0 in the modified PAM4 modulation, improves the horizontal eye opening of the outer eyes. During experimentation, an eye quality measurement of at least TDECQ=1.36 dB was obtained. The eye diagram 1400 also shows the terminating NRZ symbol.

FIG. 14B illustrates a graph 1450 of power spectral density (PSD) 1460 of a modified PAM4 format. In this embodiment, the PAM4 symbols with a pattern length L=8 are also mapped to N=13 bits as in FIG. 14A. The power spectral density (PSD) 1460 is represented on the vertical axis for a range of frequencies 1470 shown in the horizontal axis. As seen in FIG. 14B, the power spectral density 1460 of the modified PAM4 signal 1480 with probabilistic transition shaping is more constrained than for the conventional PAM4 signal 1490.

Figure 15:
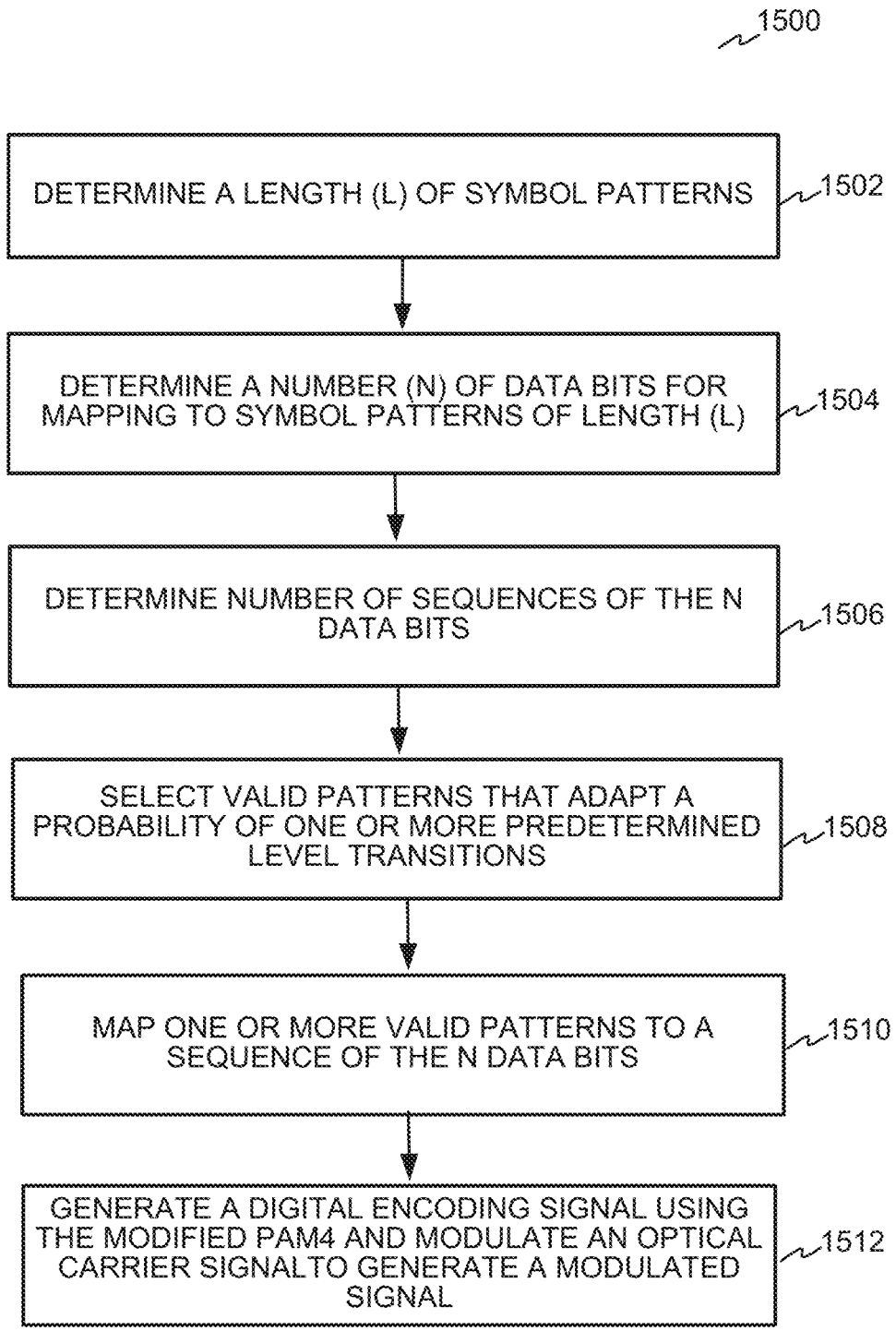
FIG. 15 illustrates a flow diagram of an embodiment of a method for generating a modified PAMx signal.

FIG. 15 illustrates a block diagram of an embodiment of a method 1500 for generating a modified PAMx modulated signal, wherein x is greater than 2. A modified PAM4 format is described in many examples herein. However, probabilistic transition shaping may be applied to other PAMx formats having an x number of amplitude levels (PAMx), wherein x is greater than 2. The method 1500 in FIG. 15 describes a generalized embodiment of encoding a modified PAMx signal having an adapted probability of a transition between at least one predetermined level. It is to be noted that this method may also be applied to other modulation formats as described further herein.

Referring to FIG. 15, a length L for the symbol patterns is determined at 1502, and a number N of data bits for mapping to the symbol patterns of length L is determined at 1504. The number of sequences of the N data bits (e.g., equal to $2^N$) is then determined at 1506.

Next, valid symbol patterns with a length L are selected at 1508. The valid patterns are selected to adapt (increase or decrease) a probability of one or more predetermined level transitions. For example, the valid patterns may be selected to exclude any patterns with transitions between the outermost levels (e.g., 0→3 and 3→0 for PAM4 or 0→7 and 7→0 for PAM8). The valid patterns may be selected such that the last symbol (called the terminating symbol) is constrained to the outermost levels (e.g., {0,3} for PAM4 or {0,7} for PAM8). In another embodiment, patterns may be selected to reduce the occurrence of transitions between asymmetrical levels, such as between 1 and 3 or between 0 and 2. in PAM4. Additionally or alternatively, patterns having two or more consecutive amplitude levels that are the same value may be selected or preferred. For example, a symbol pattern of levels 0, 2, 2, 2, 3 may be selected over a symbol pattern of levels 0, 1, 2, 1, 3. These examples are not inclusive and a probability of other level transitions may be adapted using similar methods. Other considerations in selecting the valid patterns are discussed further with respect to FIG. 16.

One or more valid patterns are then mapped to a sequence of the N data bits to generate the modified PAMx encoding at 1510. A first valid pattern may be mapped to a sequence of N data bits that begins with a 3. A second valid pattern may be mapped to the same sequence of N data bits that begins with a 0, e.g. by subtracting 3-i from the first pattern.

This mapping is used to encode a sequence of N data bits for transmission on the downstream signal. The encoding may be performed using a state machine with one or more states 510 as illustrated in FIG. 5 or using a codebook database 1000 as illustrated in FIG. 10. The encoding may also include determining the terminating symbol of the preceding symbol pattern. When the terminating symbol $S_T$ is a 0, then for the next consecutive pattern, a valid pattern with an initial symbol $S_I$ with a 0 is selected for encoding of the sequence of N data bits, e.g. such that $S_T=S_I$. When the terminating symbol is a 3, then a valid pattern that begins with a level 3 is used for encoding the next sequence of N data bits. Though PAM4 is used as an example, the same method may be implemented using other PAMx formats or other multilevel modulations wherein the amplitude levels are greater than 2.

A signal encoder 1240 generates a digital encoding signal 1242 with the modified PAMx format for the sequence of N data bits. The digital encoding signal 1242 is then used by a modulator 1250 to modulate an optical carrier signal at 1512.

The signal encoder 1240 may further encode data bits with another modulation format, such as an NRZ format. The transceiver 1230 may then generate a downstream signal 200 with multimodulation, wherein at least a first portion of the downstream signal is modulated using an NRZ format and at least a second portion is modulated using a modified PAMx format.

Figure 16:
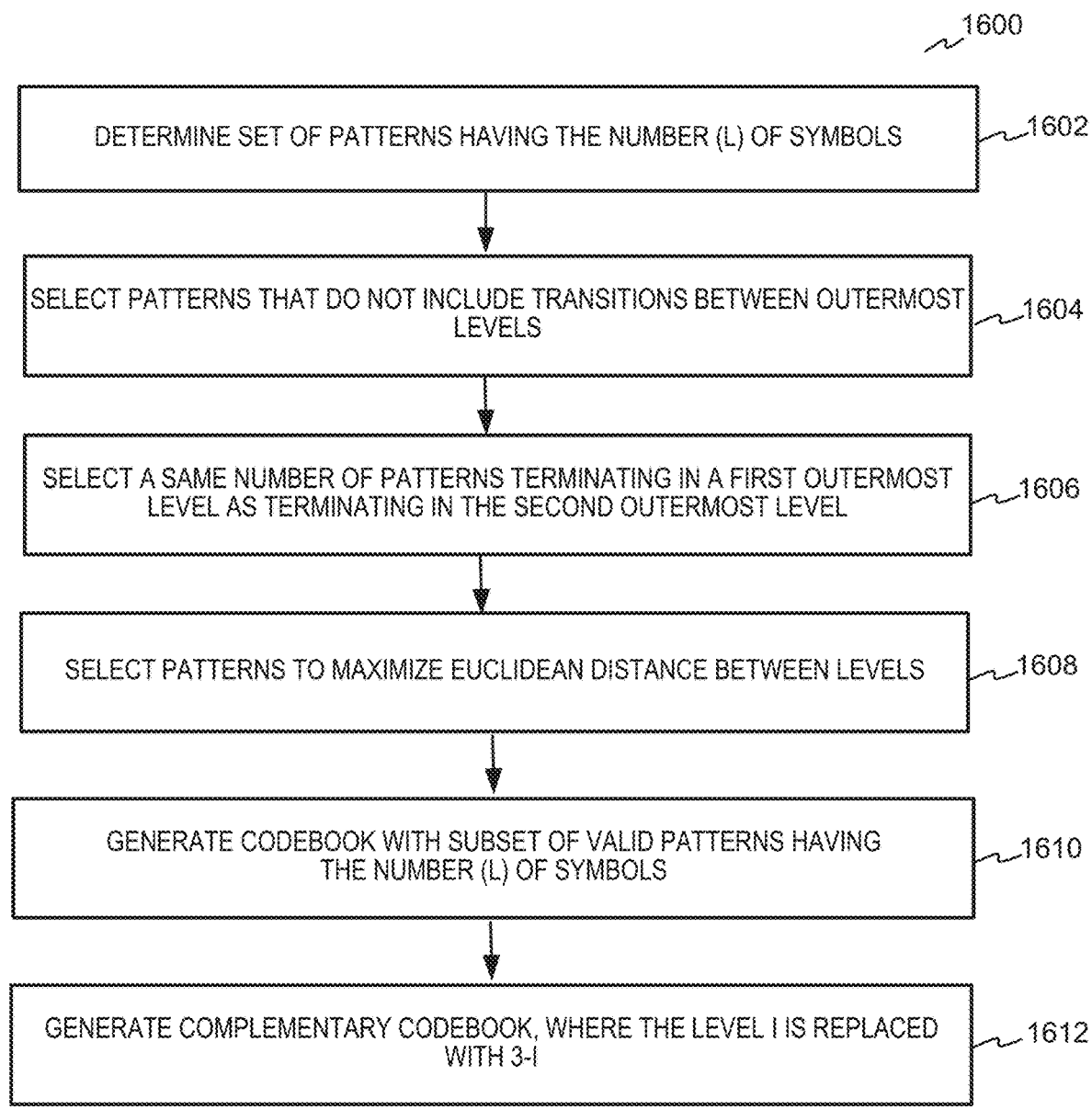
FIG. 16 illustrates a flow diagram of an embodiment of a method for selecting valid patterns of symbols with a length (L).

FIG. 16 illustrates a block diagram of an embodiment of a method 1600 for selecting valid symbol patterns with a length (L). First, the set of patterns having the number (L) of symbols is determined. For example, this set will include $4^L$ patterns for PAM4 or $8^L$ patterns for PAM8. From the total set of patterns of the PAMx symbols, a subset of valid patterns are selected based on one or more factors, wherein the subset of patterns includes less patterns than the set of patterns. The subset of valid patterns may be selected to decrease transitions between one or more predetermined levels. The subset of valid patterns may also be selected to increase transitions between one or more predetermined levels.

For example, at 1604, patterns may be selected for the subset that adapts transitions between one or more predetermined levels. As described herein, for one embodiment of modified PAMx, this selection reduces or eliminates patterns including transitions between outermost levels, such as levels 0 and 3 for PAM4. For PAM 8, this selection may eliminate patterns including transitions between levels 0 and 7 and vice versa. Alternatively or additionally, the patterns may be selected that reduces transitions between asymmetrical levels, such as between 1 and 3 or between 0 and 2 for PAM4. In another example, the patterns may be selected to reduce transitions between inner levels, such as between 1 and 2 for PAM4. In yet another example, patterns may be selected that include transitions from level 1 to level 3 but patterns including transitions between level 3 to level 1 are excluded. The selection of patterns may be selected to increase the probability of a transition between a same level, such as the transition between level 0 and level 0 or the transition between level 3 and level 3. The adapted probability of a predetermined level transition thus includes one or more of: (i) an increase or decrease in probability of a predetermined transition between two different levels; or (ii) an increase or decrease in probability of a predetermined transition between the same levels.

In an embodiment, from the subset of patterns, a same number of patterns terminating in a first predetermined level is selected as terminating in a second predetermined level at 1606. For PAM4, a same number of valid patterns ending in a first outermost level 0 may be selected as ending in a second outermost level 3. For PAM8, a same number of valid patterns ending in 0 may be selected as ending in 7.

However, the patterns do not have to end in the outermost levels. The valid patterns may be selected to end in only innermost levels (e.g., 1 or 2 in PAM4 and 3 or 4 in PAM8) or other predetermined levels.

At this point, there may still be unnecessary valid patterns. For example, in PAM4 with L=4, then there are 61 valid patterns that do not contain 0→3 or 3→0 transitions, and that terminate either at the 0 or 3 level. When PAM4 is mapped to 5 bits, then only 25 or 32 valid patterns are needed. Thus, the number of valid patterns needs to be further reduced. In this example, the valid patterns may be further selected to maximize Euclidean distance between levels at 1608. The valid patterns may be further selected to reduce a probability of transitions between asymmetrical levels or to increase a probability of transitions between a same level.

A codebook may then be generated using the subset of valid patterns having a length (L) of symbols at 1610. This subset of valid patterns is mapped to the N data bits in the codebook. In addition, a complementary codebook is generated at 1612. For PAM4, the level i is replaced with 3-i in the complementary codebook. In another embodiment, for PAM8, the level i is replaced with 7-I in the complementary codebook.

Figure 17:
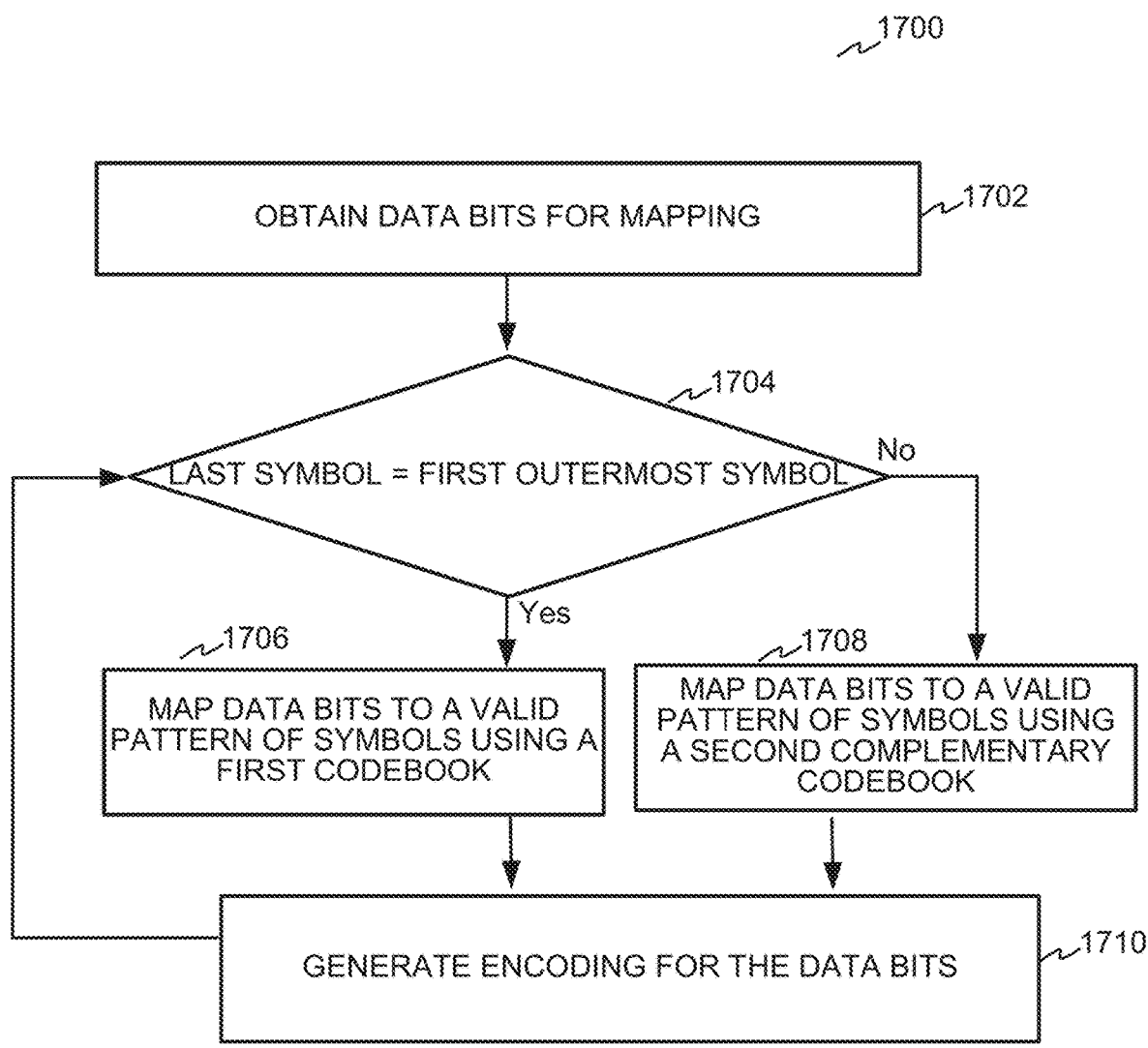
FIG. 17 illustrates a flow diagram of an embodiment of a method for encoding data bits in a modified PAMx signal.

FIG. 17 illustrates a block diagram of an embodiment of a method 1700 for encoding data bits in a modified PAMx signal. The transceiver 1230 of the OLT 110 may perform one or more of these steps using the code book database 1270 and/or at least one state machine with one or more states 510 and/or using software and/or other devices. At 1702, a set of N data bits is obtained for mapping and transmitting.

At 1704, the terminating symbol ST of the preceding symbol pattern is determined. When the terminating symbol ST is a first predetermined level (e.g. level 0 for PAM4 and for PAM8), then the N data bits are mapped using a first codebook at 1706. The first codebook includes the valid patterns of symbols that begin with the same first predetermined level. When the terminating symbol ST is a second predetermined level (e.g. level 3 for PAM4 and level 7 for PAM 8), then the N data bits are mapped using a second, complementary codebook at 1708. The second, complementary codebook includes the valid patterns of symbols that begin with the second predetermined level. Though the outermost levels are used as examples as the first and second predetermined symbol, other symbols may be encoded as the first and second predetermined symbols. The N data bits are then encoded using either the first codebook or the second, complementary codebook. As such, the terminating symbol ST of the preceding symbol pattern is at the same amplitude level as the initial symbol SI of the consecutive symbol pattern. Though codebooks are described herein, a similar process may be implemented with one or more state machines or other processor devices.

Figure 18:
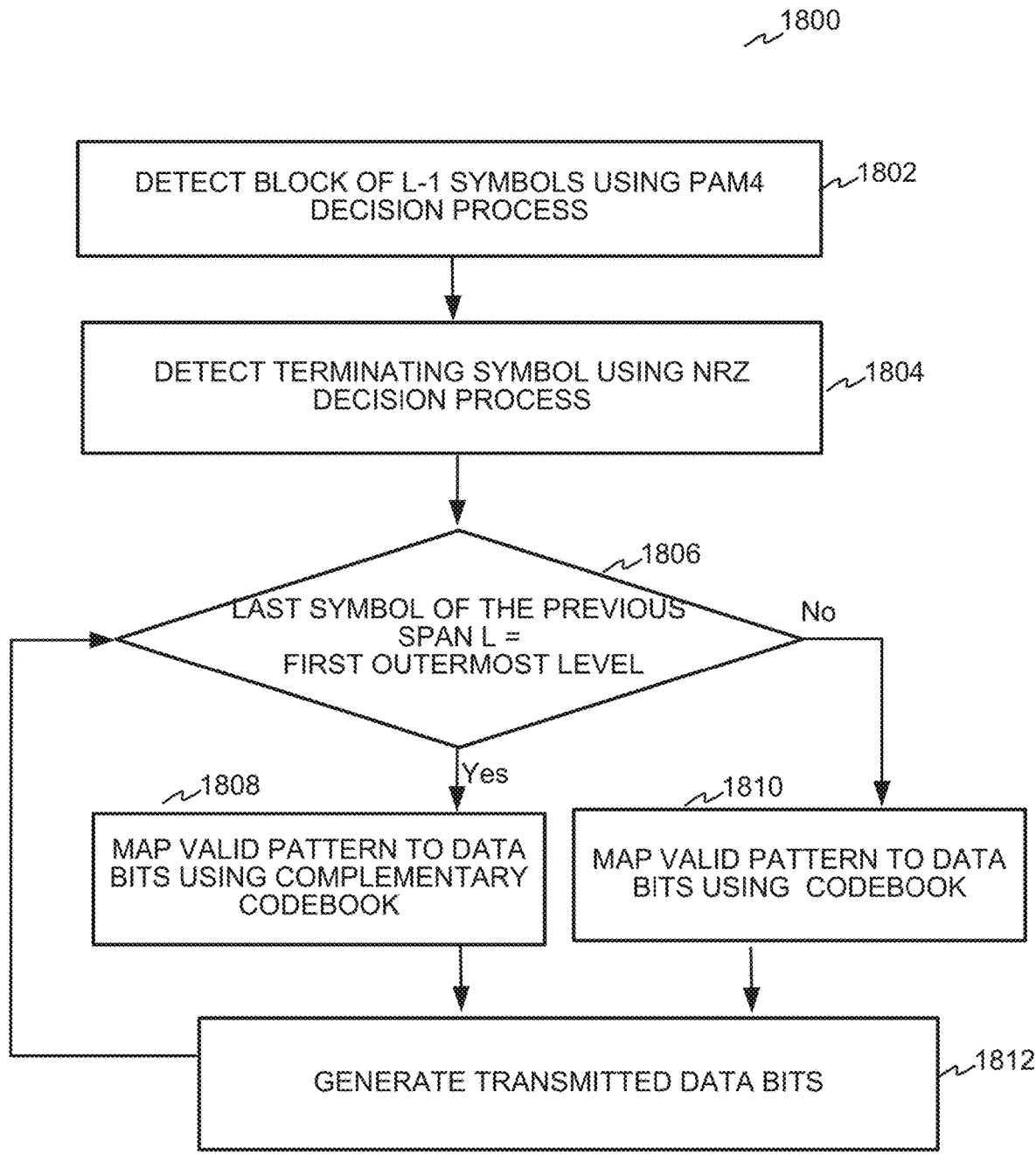
FIG. 18 illustrates a flow diagram of an embodiment of a method for decoding data bits in a modified PAMx signal.

FIG. 18 illustrates a block diagram of an embodiment of a method 1800 for decoding data bits in a modified PAMx signal. A receiver, e.g. in the ONU 130, detects a span of symbols with a length L. For the first L-1 symbols in the span, a PAMx decision process of determining one of the x levels is implemented at 1802. In an embodiment, the terminating symbol ST in the span is limited to one of two predetermined levels (e.g., outermost levels 0 or 3 for PAM4 and 0 or 7 for PAM8). So then standard NRZ or bilevel modulation decision process may be used to detect the terminating symbol ST at 1804.

Next, the predetermined level of the terminating symbol ST is determined at 1806. When the preceding terminating symbol is a first predetermined level (e.g. outermost level 0 for PAM4 and for PAM8), then a first codebook is used to decode the span of L detected symbols at 1808. The first codebook includes the valid patterns of L symbols that begin with the same first predetermined level. When the preceding terminating symbol is a second outermost level (e.g. level 3 for PAM4 or level 7 for PAM8), then a complementary codebook is used to decode the span of L detected symbols at 1810. The second, complementary codebook includes the valid patterns of L symbols that begin with the second outermost level.

When the span of L detected symbols matches a valid pattern in the selected book (i.e., codebook or complementary codebook), an estimate of the transmitted bits may be determined directly from the mapping in the selected codebook. In case the detected block of L symbols does not match a valid pattern in the selected book (codebook or complementary codebook), a valid pattern may be determined based on Euclidean distance. For example, a valid pattern in the selected codebook is determined that is nearest to the span of L detected symbols in terms of Euclidean distance. Then, the transmitted bits may be determined from the mapping in the selected codebook. When multiple valid patterns exist at the same nearest Euclidean distance, the bits wherein the nearest neighbor patterns differ may be marked as erasures for further decoding using the forward error correction (FEC) in the downstream signal 200. The transmitted data bits are then generated at 1812.

Figure 19:
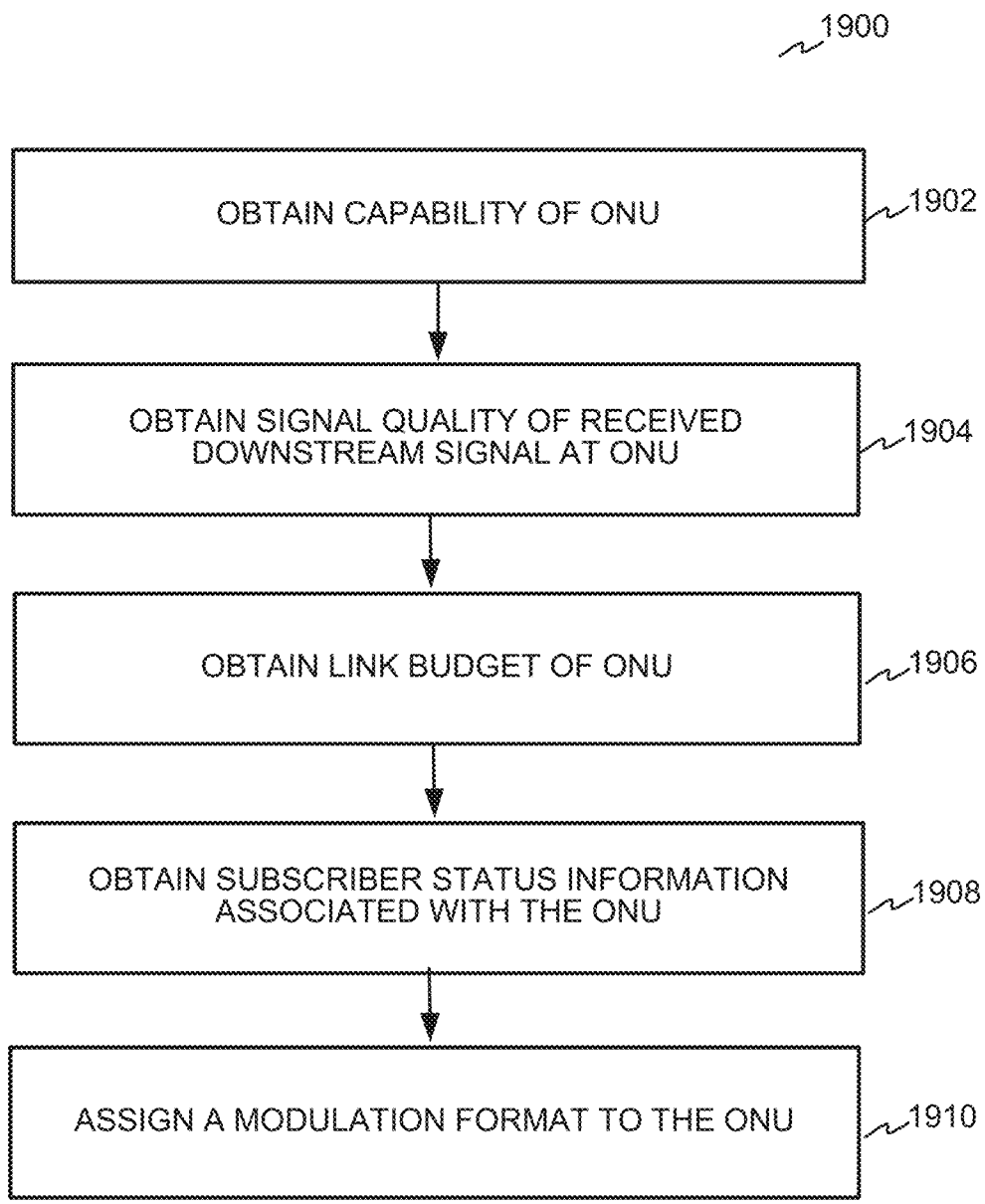
FIG. 19 illustrates a flow diagram of an embodiment of a method to determine a modulation type for an ONU in a PON.

FIG. 19 illustrates a block diagram of an embodiment of a method 1900 to determine a modulation type for an ONU 130 in a PON 100. In an embodiment, the ONUs 130 may be assigned different modulation types to achieve different bit rates. The assignment may be determined in response to one or more parameters. A first parameter may include a capability of the ONU 130 at 1902. For example, the capability may include configuration of the ONU 130 and/or equipment of the ONU 130, such as a DSP 1340 with an equalizer 1350 and CDR 1360. For example, in a flexible PON implementing NRZ format and a modified PAM4 format with probabilistic transition shaping, when an ONU 130 has not been configured for PAM4 format or does not have a DSP, then it may not be able to successfully detect and decode the modified PAM4 signal. So, such an ONU 130 may be assigned to the NRZ modulation with a lower bit rate.

In another example, the signal quality of the received downstream signal at the ONU 130 is determined at 1904. The ONU 130 may measure the signal quality and provide the information to the OLT 110. The signal quality may be measured using a signal to noise (S/N) ratio, bit error rate (BER), received power level or other parameters. In addition or alternatively, the OLT 110 may determine the link budget of the fiber to the ONU 130 at 1906. Due to differing distances from the OLT 110, the ONUs 130 may experience differing signal quality and link budget. For example, when the link budget and/or signal quality fails to meet a threshold, e.g. such that the ONU 130 may not detect a modified PAM4 signal due to ISI, the ONU 130 may be assigned to detect NRZ modulation in the downstream signal.

Another parameter that may be obtained is subscriber status information associated with the ONU 130 at 1908. The PON may have different subscriber options, e.g. with higher line rates costing more than lower line rates. Thus, even if the ONU 130 is capable of receiving and decoding a PAM4 modulation, the subscriber status may only include access to lower line rates and so the ONU is assigned to detect NRZ modulation in the downstream signal. Using one or more of these parameters, the OLT 110 determines a modulation format (e.g., NRZ or modified PAM4 or modified PAM8) for the ONU 130 at 1910. The OLT 110 may also determine an information rate for the selected modulation format. For example, depending on one or more of the above factors, the OLT 110 may determine a modified PAM4 format with a 1.5 symbol rate or with a 1.75 symbol rate. The OLT 110 may thus select the modulation format and information rate for ONUs 130. The OLT 110 then transmits data in the downstream signal 200 to the ONU 130 using the assigned modulation format and information rate.

In an embodiment, the OLT 110 may assign a different modulation format to the ONU 130 for receiving data on the downstream signal 130 than for transmitting data on the upstream signal. For example, the ONU 130 may have the capability to receive and transmit data using PAM4 but the received signal quality of the downstream signal 200 may be below a threshold at the ONU 130. The OLT 110 may then assign to the ONU 130 an NRZ modulation format for receiving the downstream signal 200 but assign a modified PAM4 or conventional PAM4 format for transmitting data on the upstream wavelength.

Figure 20:
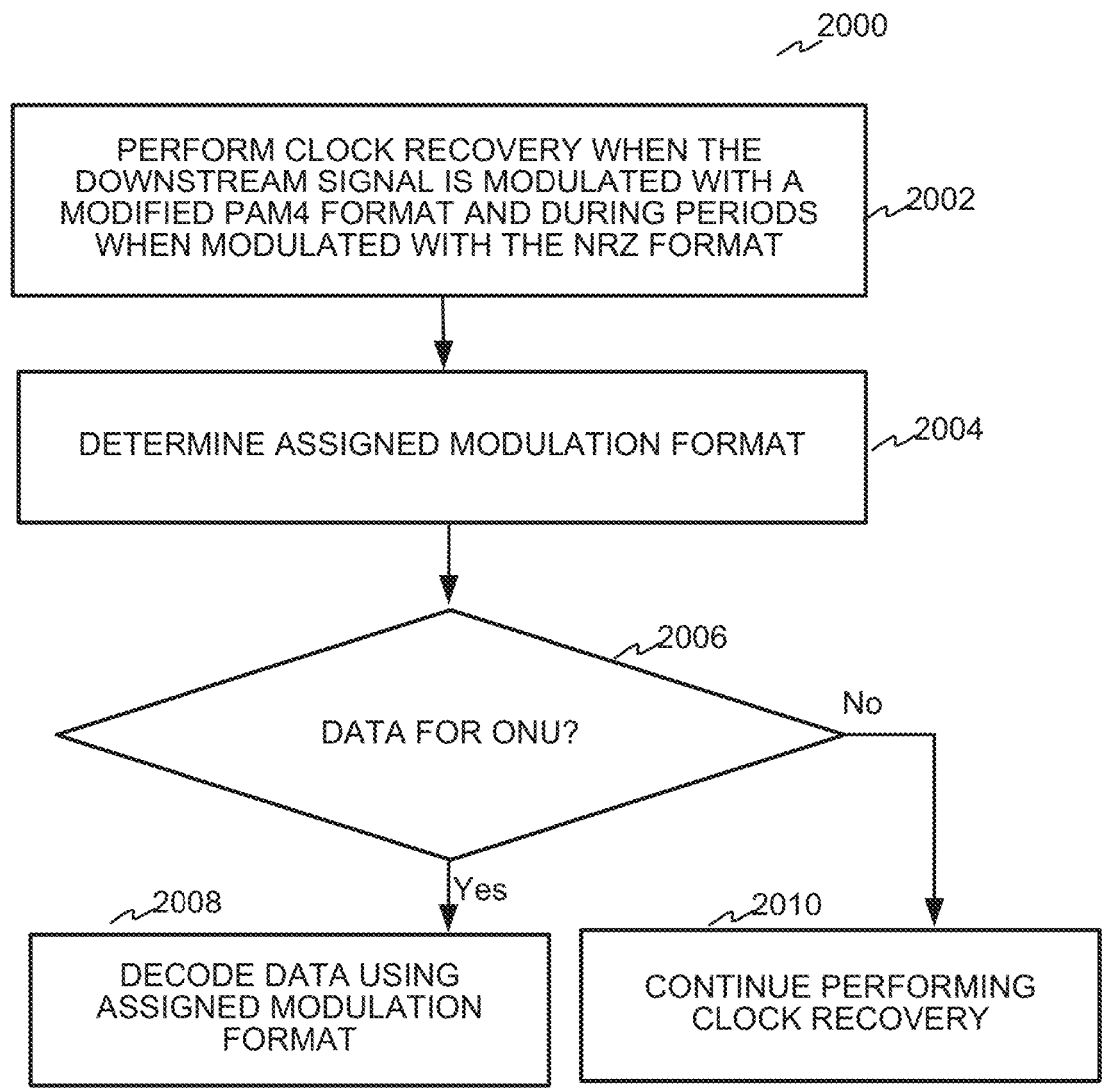
FIG. 20 illustrates a flow diagram of an embodiment of a method to decode an optical signal with a plurality of modulation formats.

FIG. 20 illustrates a block diagram of an embodiment of a method 2000 for decoding a downstream signal with a plurality of modulation formats by an ONU 130. The ONU 130 receives the downstream signal including at least a first portion with a first modulation format, such NRZ modulation, and a second portion with a second modulation format, such as modified PAMx with probabilistic transition shaping. The ONU 130 is configured to perform clock recovery during periods when the downstream signal is modulated with a modified PAMx format and during periods when modulated with the NRZ format at 2002. The ONU 130 determines its assigned modulation format, e.g. modified PAMx or NRZ or other assigned formats at 2004. The ONU 130 monitors the downstream signal for frames of data addressed to destinations associated with the ONU 130, and/or a timeslot designated for data for the ONU 130. When not receiving frames addressed to a destination associated with the ONU 130, the ONU 130 continues to perform clock recovery at 2010. When the frames are addressed for the ONU, the CDR 1360 and/or signal decoder 1330 decodes the data using its assigned modulation format at 2008. For example, when assigned modified PAMx modulation, at least the payload of the frames addressed to the ONU 130 are modulated in modified PAMx format. The ONU 130 decodes the payloads of the fames using one or more codebooks and/or one or more state machines as described herein.

In one or more embodiments described herein, a PON 100 transmits a downstream signal 200 with a plurality of modulation formats, wherein at least one of the modulation formats is a modified amplitude modulation (AM) format with x amplitude levels, wherein x is greater than 2. The modified AM modulation encodes the data bits in the downstream signal such that the probability of one or more predetermined transitions between amplitude levels is modified. This probabilistic transition shaping assists legacy ONUs 130 (e.g., configured for NRZ modulated signals) in clock recovery of the downstream signal. In addition, the modified AM modulation helps advanced ONUs 130b achieve a stable clock and data recovery (CDR) and equalizer performance by enhancing jitter and ISI tolerance.

The assignment of one of the plurality of modulation formats to an ONU 130 in the PON 100 may be based on one or more parameters. These parameters include one or more of: ONU capability, signal quality of the received downstream signal, link budget, subscriber status or other factors. The modulation format assigned to the ONU 130 in the downstream signal may be different than the modulation format assigned to the ONU 130 in the upstream signal. Thus, the modulation format, and so the line data rate, may be selected and assigned per ONU 130 in the PON 100.

The probabilistic transition shaping has been described with respect to a PAMx format. However, probabilistic transition shaping may be implemented with other complex modulations, e.g. any N-ary modulation, wherein N is greater than 2. Probabilistic transition shaping may be generalized as adapting transitions between constellation points of a constellation map for any N-ary modulation, wherein N is greater than 2.

Figure 21A:
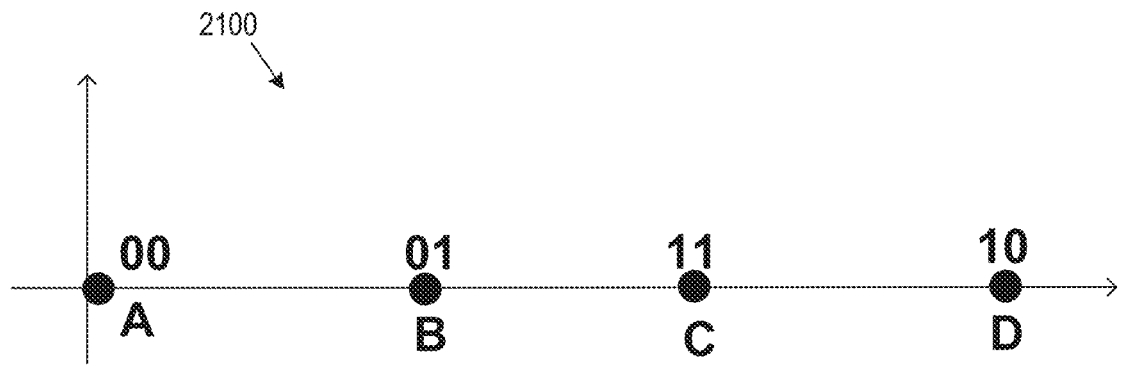
FIG. 21A illustrates a constellation map for conventional PAM4 modulation.

FIG. 21A illustrates a constellation map 2100 for conventional PAM4 modulation. In a constellation map, the distance of a constellation point from the origin represents a measure of the amplitude or power of the signal. The angle of the constellation point from the horizontal axis represents a phase shift of the carrier wave. Since PAM4 is a one-dimensional amplitude modulation with no phase shifts, the constellation points are positioned on the horizontal axis. There are $N_P=4$ constellation points that represent the four different amplitude levels in PAM4. So, constellation point A represents amplitude level 0, constellation point B represents level 1, constellation point C represents amplitude level 2 and constellation point D represents amplitude level 3.

In conventional PAM4, a symbol pattern has a length $L=1$. Each symbol, e.g. each of the constellation points on the diagram, are mapped to a sequence of $N=2$ data bits. One example of this encoding is shown in the constellation map 2100.

Figure 21B:
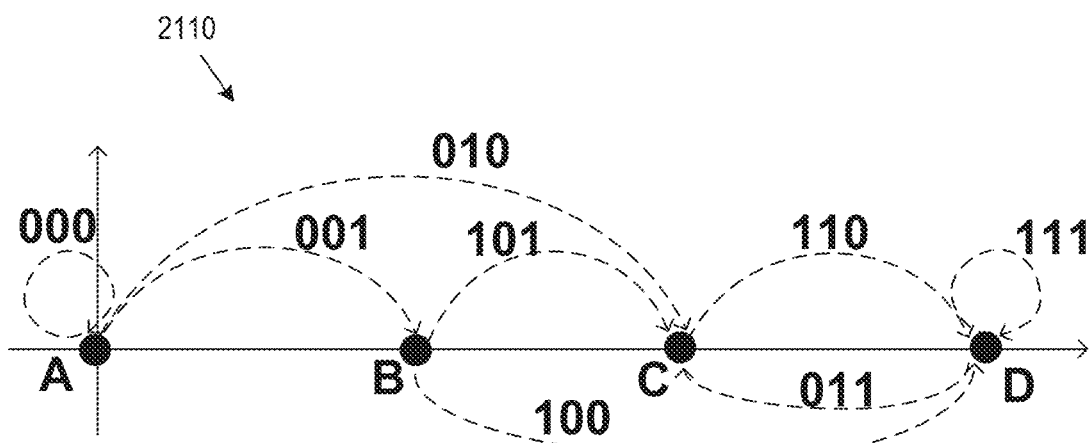
FIG. 21B illustrates a constellation map for a modified PAM4 format with probabilistic transition shaping.

FIG. 21B illustrates a constellation map 2110 for a modified PAM4 format, wherein $N=3$ data bits are mapped to constellation patterns having a length $L=2$. Two symbols, e.g., two of the constellation points on the constellation map, are mapped to $N=3$ data bits. By having constellation patterns with a length L greater than 1, the transitions between the constellation points may be adapted.

The constellation map 2110 illustrates exemplary constellation patterns and mapped data bits but is not inclusive, e.g. multiple patterns may be mapped to a same sequence of $N=3$ data bits. The dotted lines and arrows indicate the pattern of the two constellation points from the first symbol to the second symbol. In this example, the pattern of constellation points A, B is encoded to data bits 001. The pattern of constellation points A, A is encoded to data bits 000. The pattern of constellation points A, C is encoded to data bits 010. The pattern of constellation points D, D is encoded to 111. The full mapping for this example is shown in FIG. 21B.

As shown in the constellation map 2110, there is no transition between constellation point A (e.g. amplitude level 0) and constellation point D (e.g., amplitude level 3). Bits are not mapped to this pattern of constellation points A, D. This mapping decreases the probability of the transition between constellation points A and D in a modulated signal.

In addition, when mapping data bits for transmission, consecutive constellation patterns may be selected such that the terminating constellation point Pt of the first pattern and the initial constellation point Pi of the second pattern are the same (e.g., both are Point A or both are Point D). Additional or alternate mapping may be performed as described herein with respect to PAMx to adapt the probability of transitions between the constellation points.

Thus, the probabilistic transition shaping may be generalized to adapting a transition between one or more constellation points of the modulation, where a number $N_P$ of constellation points is greater than 2. This principle of adapting a probability of a transition between one or more constellation points may apply to other types of modulation formats, such as phase shift keying (PSK) or quadrature amplitude modulation (QAM).

Figure 22A:
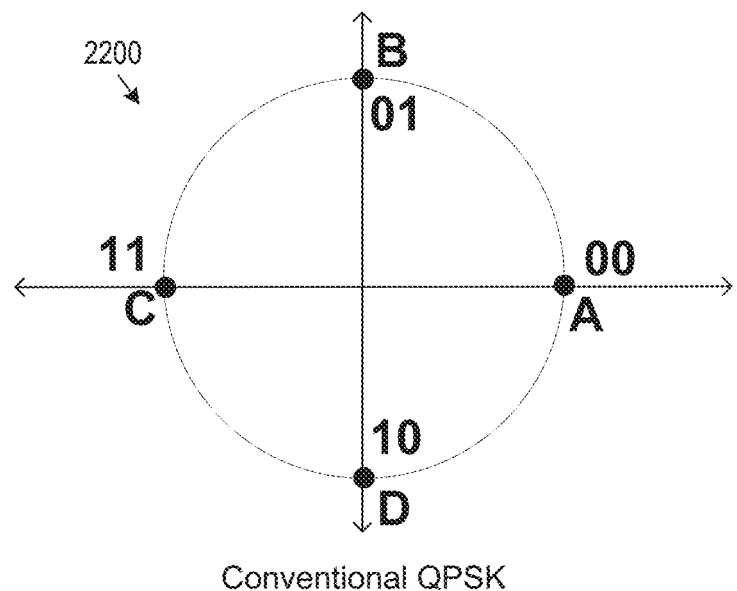
FIG. 22A illustrates an embodiment of a constellation map for a conventional phase shift keying (PSK) modulation

FIG. 22A illustrates an embodiment of a constellation map 2200 for a conventional phase shift keying (PSK) modulation with 4 phases (4-PSK). The 4-PSK modulation is also known as quadrature PSK (QPSK). The angle of a constellation point (A, B, C, D), measured counterclockwise from the horizontal axis, represents the phase of the carrier wave. So constellation point A represents a 0° phase, point B represents a 90° phase, point C represents a 180° phase, and point D represents a 270° phase. The distance of a constellation point from the origin represents a measure of the amplitude or power of the signal. Since there is no amplitude modulation in 4-PSK, the constellation points are equidistant to the origin. In conventional 4-PSK modulation, each constellation point is encoded with N=2 data bits. An example of the mapping of the N=2 data bits to each of the constellation points is shown in the constellation map 2200.

Figure 22B:
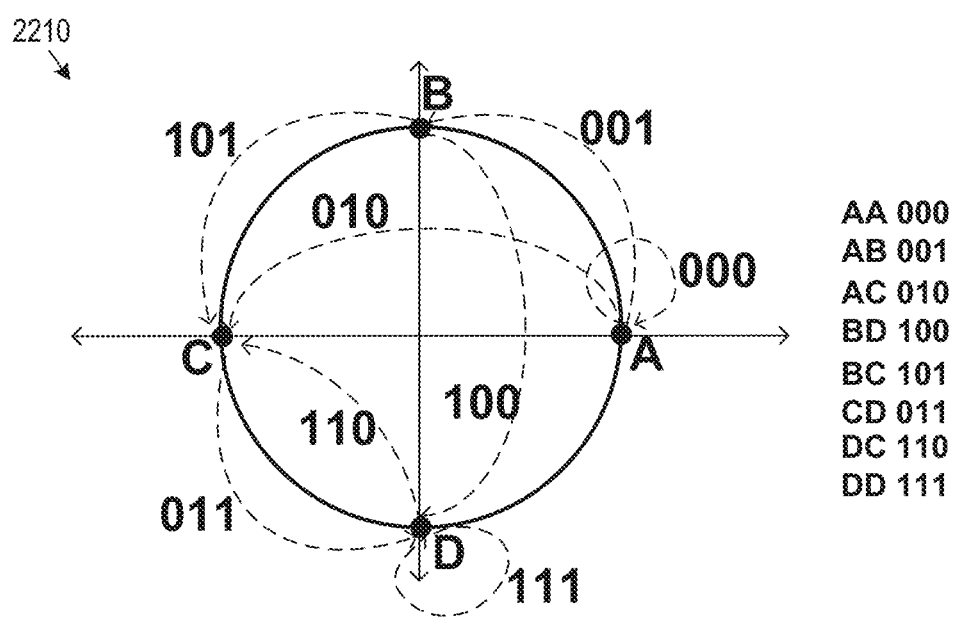
FIG. 22B illustrates an embodiment of a constellation map for a modified PSK modulation with probabilistic transition shaping.

FIG. 22B illustrates an embodiment of a constellation map 2210 for a modified 4-PSK modulation with probabilistic transition shaping. This example has N=3 data bits mapped to constellation patterns having a length L=2. As such, the constellation patterns include two constellation points. An exemplary mapping is illustrated for some constellation patterns and is not inclusive for all possible constellation patterns, e.g. multiple patterns may be mapped to a same sequence of N=3 data bits.

In this example, an adapted probability of at least one transition between one or more constellation points is implemented for the modified 4-PSK modulation. For example, bits are not mapped for a transition between constellation point A (representing 0° phase) and point D (representing a 270° phase). The example mapping may thus eliminate transitions between constellation points A and D. So these constellation patterns (e.g., phase of 0° to 270° and phase of 270° to 0°) are not selected for mapping and are not transmitted as one of the mapped constellation patterns. This mapping thus adapts the probability of the 0° to 270° phase transition and the 270° to 0° phase transition in a modified 4-PSK signal.

In addition, when mapping bits for transmission, consecutive constellation patterns may be selected such that the terminating constellation point Pt of the first pattern and the initial constellation point Pi of the second pattern are the same, e.g., both may be predetermined to be Point A. This mapping increases the probability of the transitions between Point A and Point A. Additional or alternate mapping may be performed as described herein with respect to PAMx to adapt the probability of transitions between the constellation points in 4-PSK. Thus, the probabilistic transition shaping may be generalized to PSK modulation format by adapting a probability of a transition between one or more constellation points during mapping of the N bits.

Figure 23A:
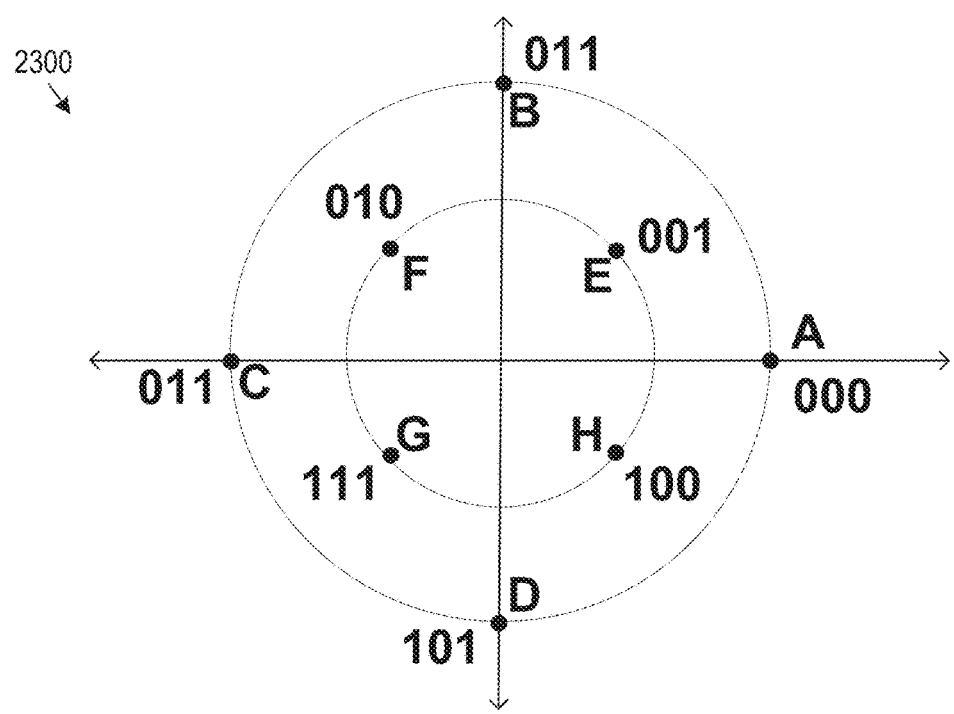
FIG. 23A illustrates an embodiment of a constellation map for a conventional QAM.

FIG. 23A illustrates an embodiment of a constellation map 2300 for a conventional QAM with 8 constellation points (8 QAM). Higher order QAM formats may also be implemented herein, such as 16 QAM, 32 QAM and 64 QAM, but for simplicity, 8 QAM is used as an example. QAM includes both phase and amplitude modulation using two carrier waves of the same frequency that are out of phase with each other by 90°. So the constellation points for QAM vary by both phase and amplitude. As such, as seen in FIG. 23A, the constellation points have varying distances from the origin and from the horizontal axis. In a conventional 8 QAM format, each of the number $N_P$=8 of constellation points are encoded with N=3 bits for a 3 bit/symbol rate. An example of one possible mapping of the N=3 bits to each of the constellation points is shown in FIG. 23A.

Figure 23B:
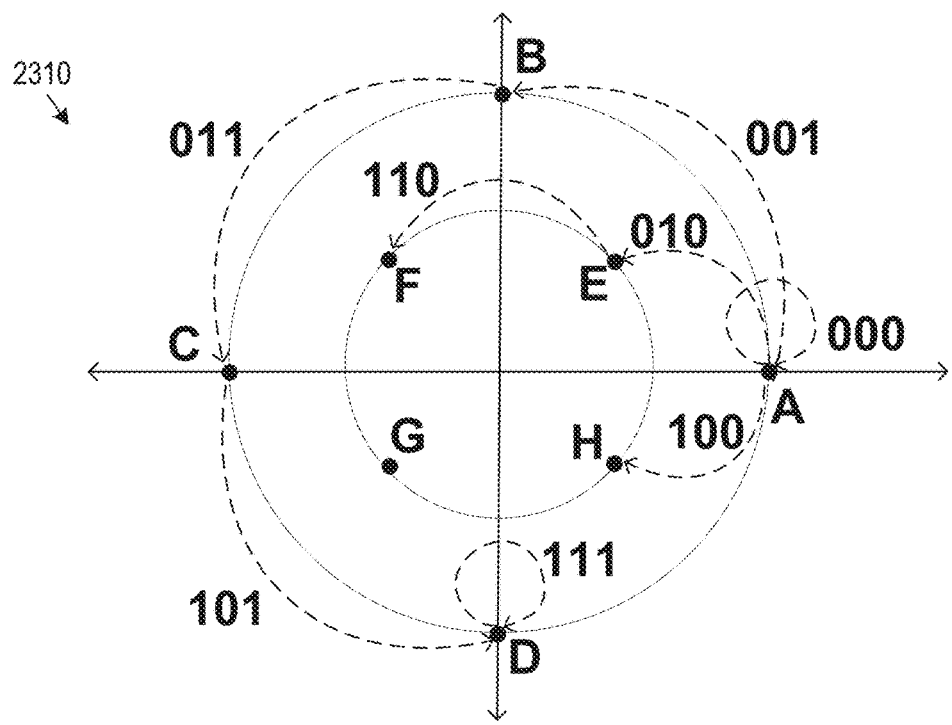
FIG. 23B illustrates an embodiment of a constellation map for a modified QAM modulation with probabilistic transition shaping.

FIG. 23B illustrates an embodiment of a constellation map 2310 for a modified 8 QAM modulation with probabilistic transition shaping. For simplicity, this example has N=3 data bits mapped to constellation patterns having a length L=2. As such, the constellation patterns include two constellation points. An exemplary mapping is illustrated but additional and/or alternate bit mappings may be implemented as well.

In this example, data bits are not mapped for a transition between constellation points A and D. The example mapping may thus eliminate transitions between constellation points A and D. So these symbol patterns (e.g., phase shift of 0° to 270° and phase shift of 270° to 0° at a same amplitude) is not selected for mapping and is not transmitted as one of the mapped symbol patterns. This mapping thus adapts the probability of the 0° to 270° phase transition and the 270° to 0° phase transition in a modified QAM signal. In another example, there is no mapping for a transition between constellation points B and D. This mapping thus adapts the probability of the 90° to 270° phase transition and the 270° to 90° phase transition in a modified QAM signal. Thus, the probabilistic transition shaping may be generalized to QAM modulation format by adapting a probability of a transition between one or more constellation points.

The number N of data bits and the length L of constellation patterns may be varied to generate a modified 8-QAM format. For example, N=6 data bits may be mapped over symbol patterns with a length L=4. In another example, N=13 data bits may be mapped to symbol patterns having a length L=8. In addition, the probability of alternate or additional transitions may be increased or decreased.

Figure 24:
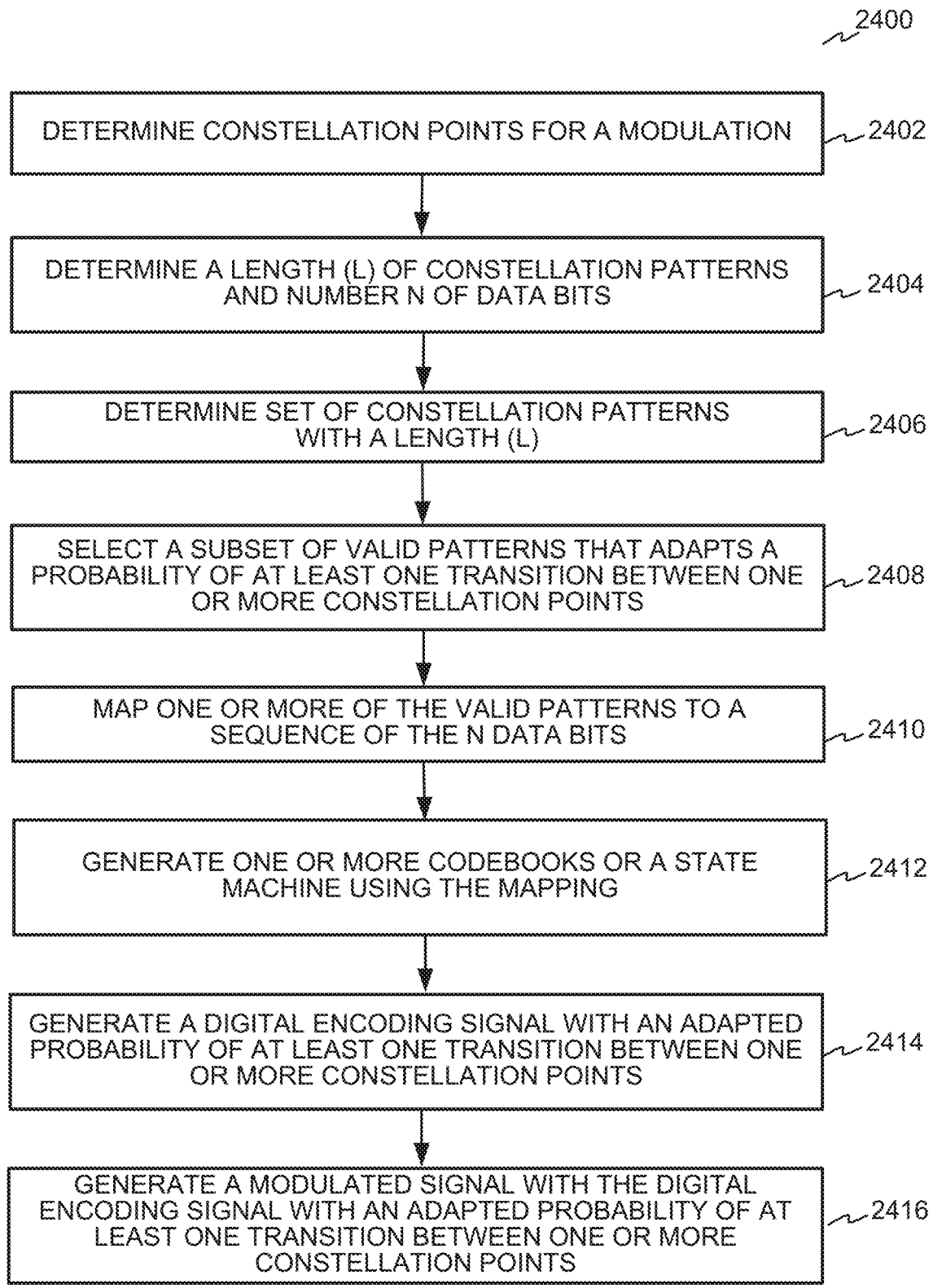
FIG. 24 illustrates a flow diagram of an embodiment of a method for generating a modulated signal with probabilistic transition shaping

FIG. 24 illustrates a flow diagram of an embodiment of a method 2400 for generating a modulated signal with probabilistic transition shaping. In general, modulation formats with a number NP of constellation points greater than two may be modified to include probabilistic transition shaping. The number NP of constellation points for a modulation format is determined at 2402. The length L of constellation patterns and number N of data bits is selected at 2404. The calculations shown in FIG. 9 may be used in this determination. For example, the number of valid patterns of length L is obtained along with the number of bits that can be mapped to the number of valid patterns. The desired symbol rate and bit rate may also be considered.

The set of constellation patterns with the length L is determined at 2406, and the subset of valid patterns is selected at 2408. One or more parameters as described herein may be used in the determination. For example, constellation patterns including one or more transitions between constellation points may be eliminated. Or constellation patterns only terminating and/or beginning with one or more constellation points may be selected. This selection of valid patterns adapts the probability of one or more transitions between constellation points.

The N data bits are then mapped to one or more of the valid patterns of constellation points at 2410. For example, a sequence of N data bits may be mapped to a first valid pattern with a predetermined initial constellation point $P_I$ and a second valid pattern with another predetermined initial constellation point $P_I$. In another example, a sequence of N data bits may be mapped to a first valid pattern with a predetermined terminating constellation point $P_T$ and a second valid pattern with another predetermined terminating constellation point $P_T$. The mapped sequences of data bits and associated constellation patterns are used to generate one or more codebooks. Alternatively or in addition thereto, at least one state machine with a plurality of states is generated using the mapping.

During use, a digital encoding signal is generated with an adapted probability of at least one transition between one or more constellation points at 2414. In an embodiment, as described herein, probabilistic transition shaping may also be performed during selection of consecutive constellation patterns in the digital encoding signal. For example, a first constellation pattern is selected with a terminating symbol or constellation point $P_T$. The next consecutive constellation pattern having an initial constellation point $P_I$ is selected such that the constellation points of $P_T$ and $P_I$ are the same. In another embodiment, the consecutive constellation patterns may be selected such that the constellation points of $P_T$ and $P_I$ are one of a plurality of predetermined patterns. Some patterns of constellation points may be more advantageous. So the two consecutive patterns are selected such that constellation points $P_T$ and $P_I$ are one of the plurality of predetermined patterns. The digital encoding signal may be generated using one or more codebooks and/or using one or more state machines.

In step 2416, the digital encoding signal is then used to generate a modulated signal with an adapted probability of at least one transition between one or more constellation points. The modulated signal may be an optical signal, a wireless electromagnetic signal or electronic signal.

The specific devices and portions or elements of devices described herein are not required and may be substituted for one or more different devices or elements. Additional devices and elements of devices may also be included though not described or illustrated herein. One or more methods or steps of a method described herein may not be performed, or steps or methods may be performed in addition to those described. Still further, the sequence in which methods or steps of methods are listed are not necessarily the order in which they are performed. Also, the concepts have been described with reference to specific embodiments. However, one of ordinary skill in the art appreciates that various modifications and changes can be made without departing from the scope of the claims as set forth below. Accordingly, the specification and figures are to be regarded in an illustrative rather than a restrictive sense, and all such modifications are intended to be included within the scope of the claims.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

Although multiple embodiments of the present invention have been illustrated in the accompanying Drawings and described in the foregoing Detailed Description, it should be understood that the present invention is not limited to the disclosed embodiments, but is capable of numerous rearrangements, modifications, and substitutions without departing from the invention as set forth and defined by the following claims.

The invention claimed is:

1. An optical device, comprising:
a signal encoder configured to generate a digital encoding signal using a first modulation format and a different, second modulation format, wherein the second modulation format is a modified pulse amplitude modulation having x amplitude levels (PAMx), wherein x is greater than 2; and
a modulator for modulating a first wavelength of an optical signal using the digital encoding signal, by modulating a first portion of the optical signal with the first modulation format and modulating a second portion of the optical signal with the second modulation format, wherein the modulator modulates the second portion of the optical signal modulated with the modified PAMx format by selecting consecutive symbol patterns to generate a first adapted probability of a first transition between a first pair of amplitude levels that is greater than a second adapted probability of a second transition between a different second pair of amplitude levels.

2. The optical device of claim 1, wherein the optical device is configured to broadcast the modulated optical signal to a plurality of optical network units (ONUs) in a point to multipoint optical network.

3. The optical device of claim 2, wherein the optical device includes:
at least one processor and at least one memory, wherein the at least one memory stores instructions that, when executed by the at least one processor, causes the optical device to:
assign the first modulation to a first ONU of the plurality of ONUs; and
assign the second modulation to a second ONU of the plurality of ONUs.

4. The optical device of claim 3, wherein the at least one memory stores instructions that when executed by the at least one processor, cause the optical device to:
obtain one or more parameters associated with at least the first ONU and the second ONU, wherein the parameters include one or more of: configuration information; signal quality of the optical signal; link budget; or subscriber status information.

5. The optical device of claim 4, wherein the at least one memory stores instructions that when executed by the at least one processor, cause the optical device to:
assign the first modulation to the first ONU in response to the one or more parameters associated with the first ONU; and
assign the second modulation to the second ONU in response to the one or more parameters associated with the second ONU.

6. The optical device of claim 1, wherein the first modulation format includes a non-return to zero (NRZ) format and wherein the second modulation format includes a modified 4-level pulse amplitude modulation (PAM4), wherein the NRZ format has a lower bit rate than the modified PAM4 format.

7. The optical device of claim 1, wherein the signal encoder is configured to generate the digital encoding signal using the PAMx format by at least one of:
encoding blocks of N data bits to a set of symbol patterns of L symbols using one or more codebooks, wherein the set of symbol patterns includes the first adapted probability of the first transition between the first pair of amplitude levels that is greater than the second adapted probability of the second transition between the different second pair of amplitude levels; or
encoding, using at least one state machine with a plurality of states, the blocks of N data bits to the set of symbol patterns of L symbols, wherein the mapped constellation patterns have the first adapted probability of the first transition between the first pair of amplitude levels that is greater than the second adapted probability of the second transition between the different second pair of amplitude levels.

8. The optical device of claim 1,
wherein the first transition between the first pair of amplitude levels includes a transition between a first amplitude level and the same first amplitude level and the second transition between the different second pair of amplitude levels includes a transition between the first amplitude level and a different, second amplitude level.

9. The device of claim 8, wherein the signal encoder is configured to select the consecutive first and second symbol patterns to generate the first adapted probability of the first transition between the first pair of amplitude levels by:
selecting the first symbol pattern having a terminating symbol $S_T$; and
selecting the second symbol pattern having an initial symbol $S_I$, wherein an amplitude level of $S_T$ and $S_I$ is the same.

10. A method of an optical device, comprising:
generating by a signal encoder a digital encoding signal using a first modulation format and a different, second modulation format, wherein the second modulation format is a modified pulse amplitude modulation having x amplitude levels (PAMx), wherein x is greater than 2; and
modulating by a modulator a first wavelength of an optical signal using the digital encoding signal, wherein the modulator modulates a first portion of the optical signal with the first modulation format and the modulator modulates a second portion of the optical signal with the second modulation format, wherein the modulator modulates the second portion of the optical signal with the modified PAMx format by selecting consecutive symbol patterns to generate a first adapted probability of a first transition between a predetermined first pair of amplitude levels that is greater than a second adapted probability of a second transition between a predetermined different pair of amplitude levels.

11. The method of claim 10, further comprising:
broadcasting by the optical device the modulated optical signal to a plurality of optical network units (ONUs) in a point to multipoint optical network.

12. The method of claim 11, further comprising:
assigning by the optical device the first modulation to a first ONU of the plurality of ONUs; and
assigning by the optical device the second modulation to a second ONU of the plurality of ONUs.

13. The method of claim 12, further comprising:
obtaining by the optical device one or more parameters associated with at least the first ONU and the second ONU, wherein the parameters include one or more of: configuration information; signal quality of the optical signal; link budget; or subscriber status information.

14. The method of claim 13, further comprising:
assigning by the optical device the first modulation to the first ONU in response to the one or more parameters associated with the first ONU; and
assigning by the optical device the second modulation to the second ONU in response to the one or more parameters associated with the second ONU.

15. The method of claim 10, wherein the first modulation format includes a non-return to zero (NRZ) format and wherein the second modulation format includes a 4-level pulse amplitude modulation (PAM4), wherein the NRZ format has a lower bit rate than the modified PAM4 format.

16. The method of claim 10, wherein generating by the signal encoder the digital encoding signal using the different, second modulation format, wherein the second modulation format is the modified PAMx, wherein x is greater than 2, comprises at least one of:
encoding by the signal encoder blocks of N data bits to a set of symbol patterns of L symbols using one or more codebooks, wherein the mapped constellation points exhibit the first adapted probability of the first transition between the predetermined first pair of amplitude levels that is greater than the second adapted probability of the second transition between the predetermined different pair of amplitude levels; or
encoding by the signal encoder, using at least one state machine with a plurality of states, the blocks of N data bits to the set of symbol patterns of L symbols, wherein the-mapped constellation patterns exhibit the first adapted probability of the first transition between the predetermined first pair of amplitude levels that is greater than the second adapted probability of the second transition between the predetermined different pair of amplitude levels.

17. The method of claim 10, wherein generating by the signal encoder the digital encoding signal using the different, second modulation format, wherein the second modulation format is the modified PAMx, wherein x is greater than 2, comprises at least one of:
encoding blocks of N data bits to a set of symbol patterns of L symbols, wherein the set of symbol patterns of L symbols includes the first adapted probability of the first transition between a first amplitude level and a same first amplitude level that is greater than the second adapted probability of the second transition between the first amplitude level and a different, second amplitude level.

18. The method of claim 10, further comprising:
selecting by the signal encoder consecutive first and second symbol patterns of L symbols to generate the first adapted probability between the predetermined first pair of amplitude levels that is greater than the second adapted probability of the second transition between the predetermined different pair of amplitude levels, wherein the predetermined first pair of amplitude levels includes a first amplitude level and the same first amplitude level and the predetermined different, second pair of amplitude levels includes the first amplitude level and a different second amplitude level.

19. The method of claim 18, wherein selecting by the signal encoder the consecutive first and second symbol patterns to generate the first transition between the predetermined first pair of amplitude levels, wherein the predetermined first pair of amplitude levels includes the first amplitude level and the same first amplitude level, comprises:

selecting the first symbol pattern having a terminating symbol $S_T$; and selecting the second symbol pattern having an initial symbol $S_I$, wherein an amplitude level of $S_T$ and $S_I$ is the same.

20. The method of claim 10, further comprising:

selecting by the signal encoder consecutive first and second symbol patterns of L symbols to generate the first adapted probability between the predetermined first pair of amplitude levels that is greater than the second adapted probability of the second transition between the predetermined different, second pair of amplitude levels, wherein the predetermined first pair of amplitude levels includes a lowest assigned amplitude level in the modified PAMx format and the same lowest assigned amplitude level and the predetermined different pair of amplitude levels includes the lowest assigned amplitude level and a highest assigned amplitude level in the modified PAMx format.

21. The method of claim 10, further comprising:

selecting by the signal encoder consecutive first and second symbol patterns of L symbols to generate the first adapted probability between the first pair of amplitude levels that is greater than the second adapted probability of the second transition between the different pair of amplitude levels, wherein the predetermined first pair of amplitude levels includes a highest amplitude level assigned in the modified PAMx format and the same highest amplitude level and the predetermined different pair of amplitude levels includes the same highest amplitude level and a lowest amplitude level assigned in the modified PAMx format.

* * * * *